United States Patent
Yamamoto

(10) Patent No.: US 6,984,575 B2
(45) Date of Patent: Jan. 10, 2006

(54) FABRICATION PROCESS OF A SEMICONDUCTOR INTEGRATED CIRCUIT DEVICE

(75) Inventor: Naoki Yamamoto, Kawaguchi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/717,705

(22) Filed: Nov. 21, 2003

(65) Prior Publication Data
US 2004/0121526 A1    Jun. 24, 2004

(30) Foreign Application Priority Data
Dec. 20, 2002    (JP) .......................... P2002-369422

(51) Int. Cl.
H01L 21/3205    (2006.01)
H01L 21/44    (2006.01)
(52) U.S. Cl. ...................................... 438/585; 438/660
(58) Field of Classification Search ................ 438/197, 438/585, 652, 655, 660, 664, 682, 684, 758, 438/778, 787, 791
See application file for complete search history.

(56) References Cited

U.S. PATENT DOCUMENTS

| | | | |
|---|---|---|---|
| 6,197,702 B1 | 3/2001 | Tanabe et al. | |
| 6,262,445 B1 * | 7/2001 | Swanson et al. | 257/288 |
| 6,284,634 B1 | 9/2001 | Rha | |
| 6,306,698 B1 * | 10/2001 | Wieczorek et al. | 438/197 |
| 6,323,519 B1 * | 11/2001 | Gardner et al. | 257/336 |
| 6,514,808 B1 * | 2/2003 | Samavedam et al. | 438/197 |
| 6,518,636 B2 * | 2/2003 | Segawa et al. | 257/411 |
| 6,608,356 B1 * | 8/2003 | Kohyama et al. | 257/412 |
| 6,686,277 B1 * | 2/2004 | Tai | 438/664 |

FOREIGN PATENT DOCUMENTS

| | | |
|---|---|---|
| JP | 2000-223439 | 1/1999 |
| JP | 2000-243753 | 7/1999 |
| JP | 2002-93743 | 9/2000 |

* cited by examiner

Primary Examiner—Scott Geyer
(74) Attorney, Agent, or Firm—Reed Smith LLP; Stanley P. Fisher, Esq.; Juan Carlos A. Marquez, Esq.

(57) ABSTRACT

Disclosed is a fabrication process of a highly reliable semiconductor device formed by stacking and pattering a polycrystalline silicon film, a tungsten nitride film and a tungsten film over a gate insulator film on a semiconductor substrate, thereby forming gate electrodes. Then, a conductive plasma processing is performed using an ammonia gas at a temperature for the semiconductor substrate of 500° C. or lower, thereby nitriding the side wall for the gate electrode to form a nitride film, and then conducting plasma processing by using an oxygen gas in a state at a temperature for the semiconductor substrate of 500° C. or lower thereby restoring damages or defects in the silicon oxide film present in the surface portion of the semiconductor substrate at the periphery of the gate electrode.

17 Claims, 18 Drawing Sheets

1: SUBSTRATE
5: GATE INSULATOR FILM
6: POLYCRYSTALLINE SILICON FILM
7: TUNGSTEN NITRIDE FILM
8: TUNGSTEN FILM
10a, 10b, 10c: GATE ELECTRODE
12: NITRIDE FILM

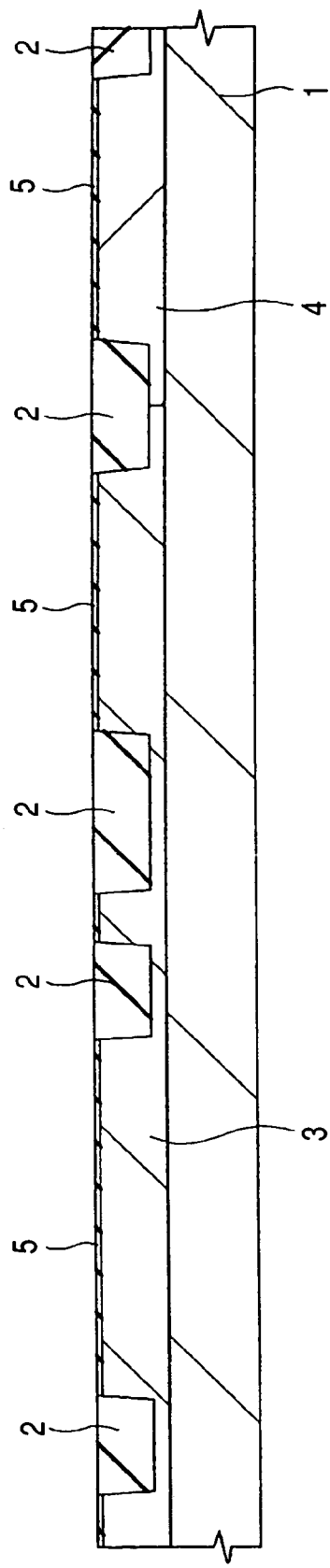
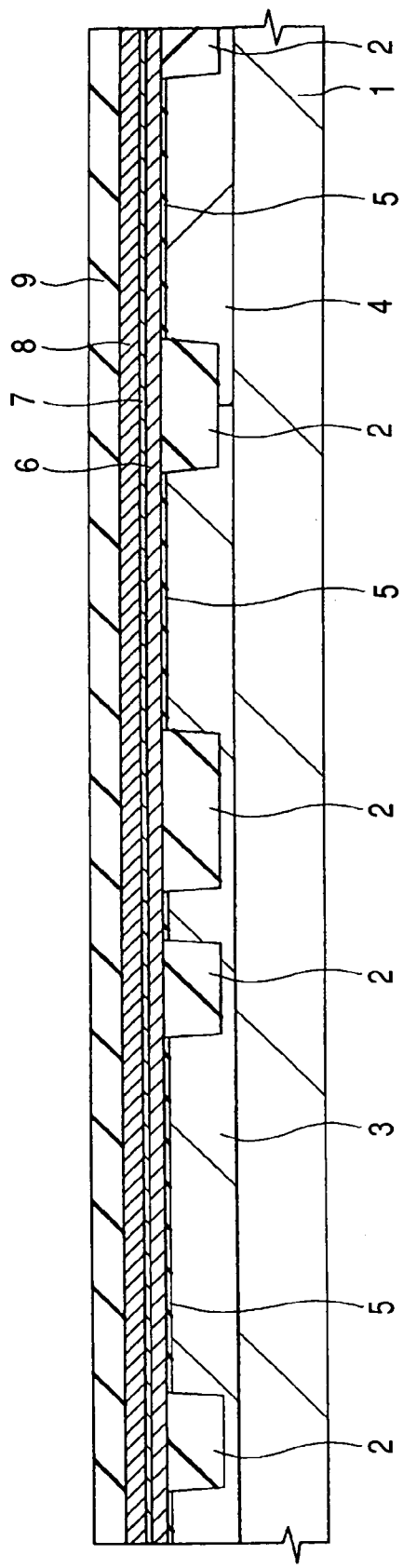

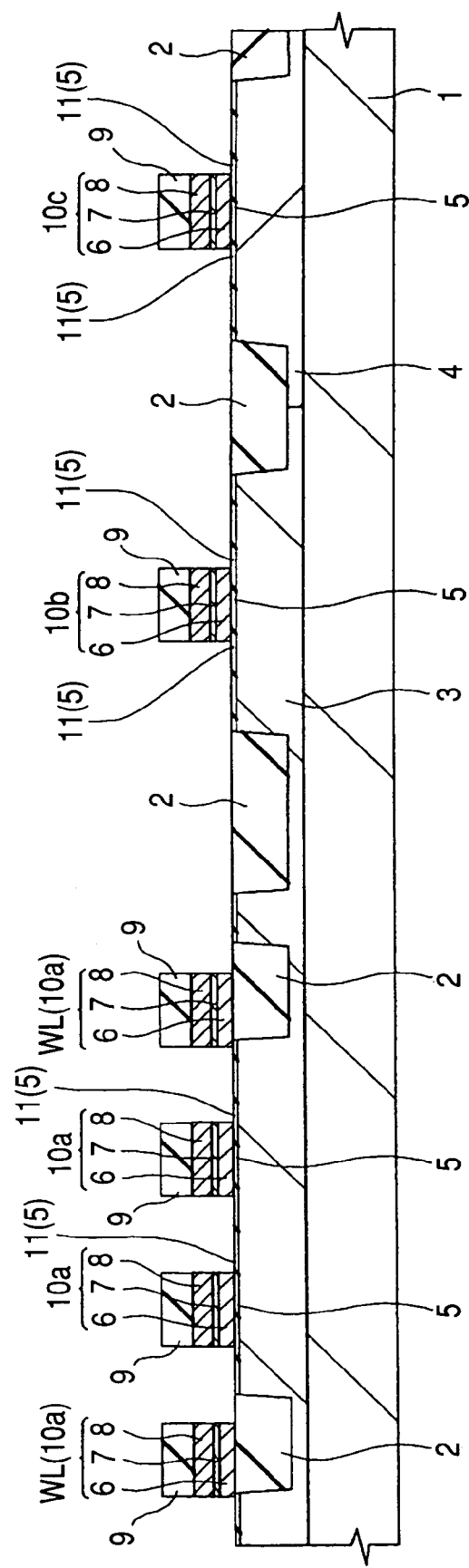

1: SUBSTRATE
5: GATE INSULATOR FILM
6: POLYCRYSTALLINE SILICON FILM
7: TUNGSTEN NITRIDE FILM
8: TUNGSTEN FILM
10a, 10b, 10c: GATE ELECTRODE
12: NITRIDE FILM

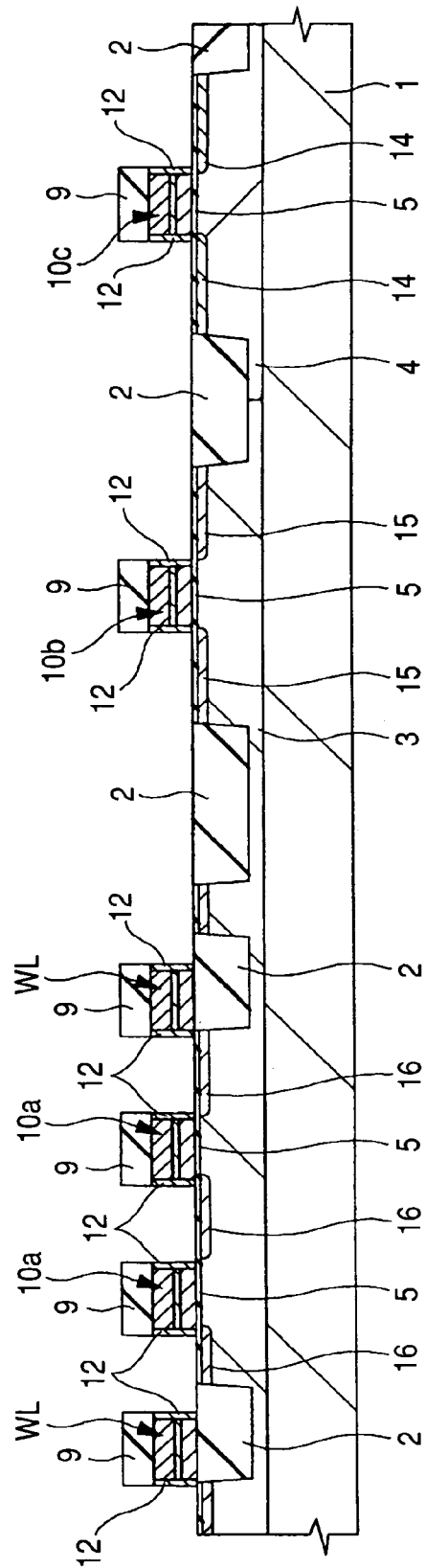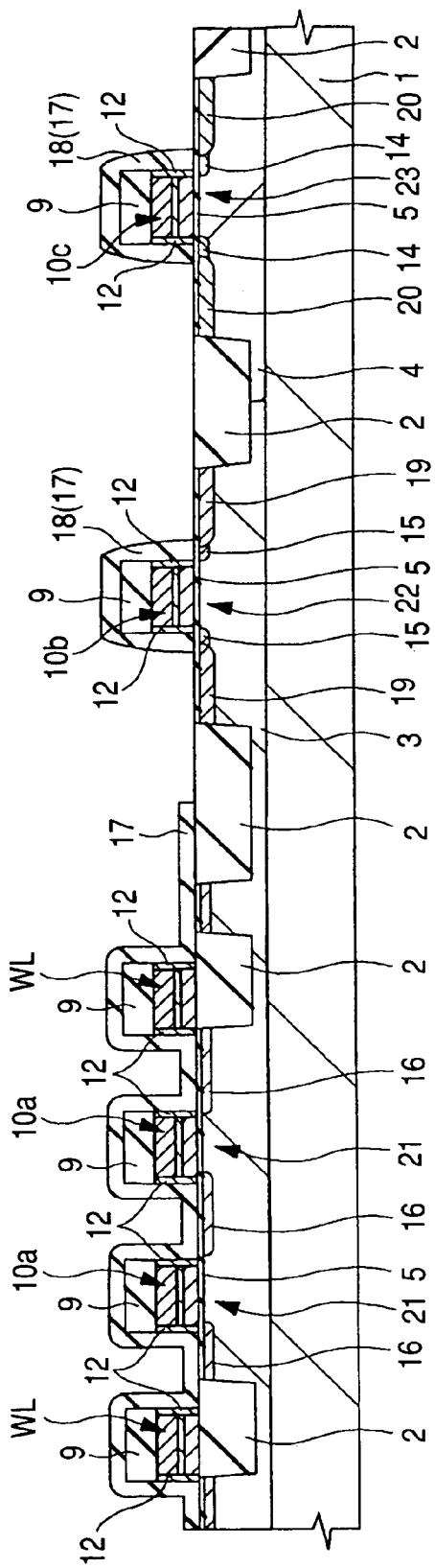

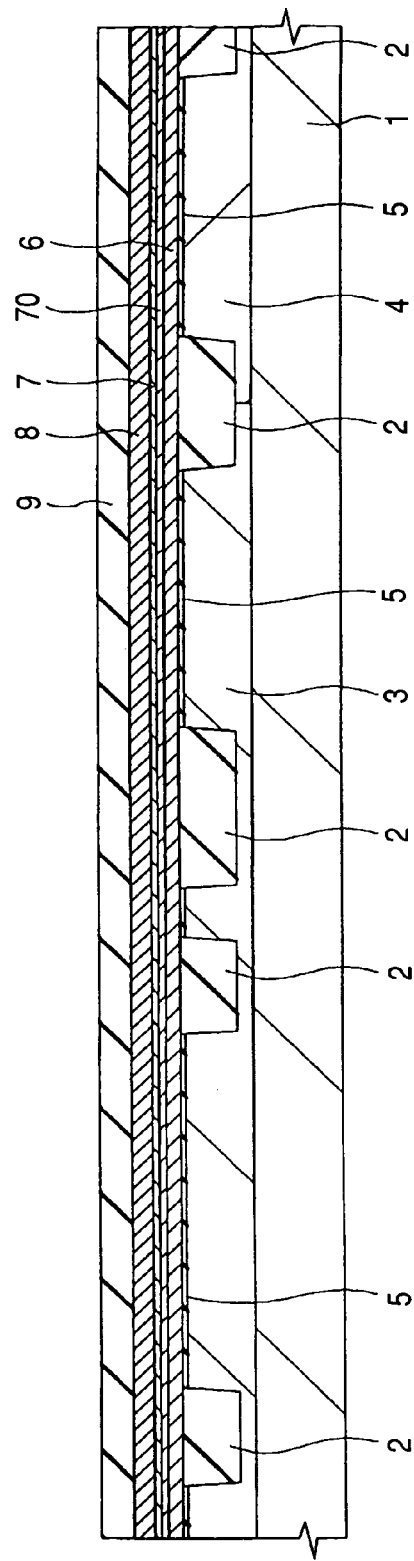
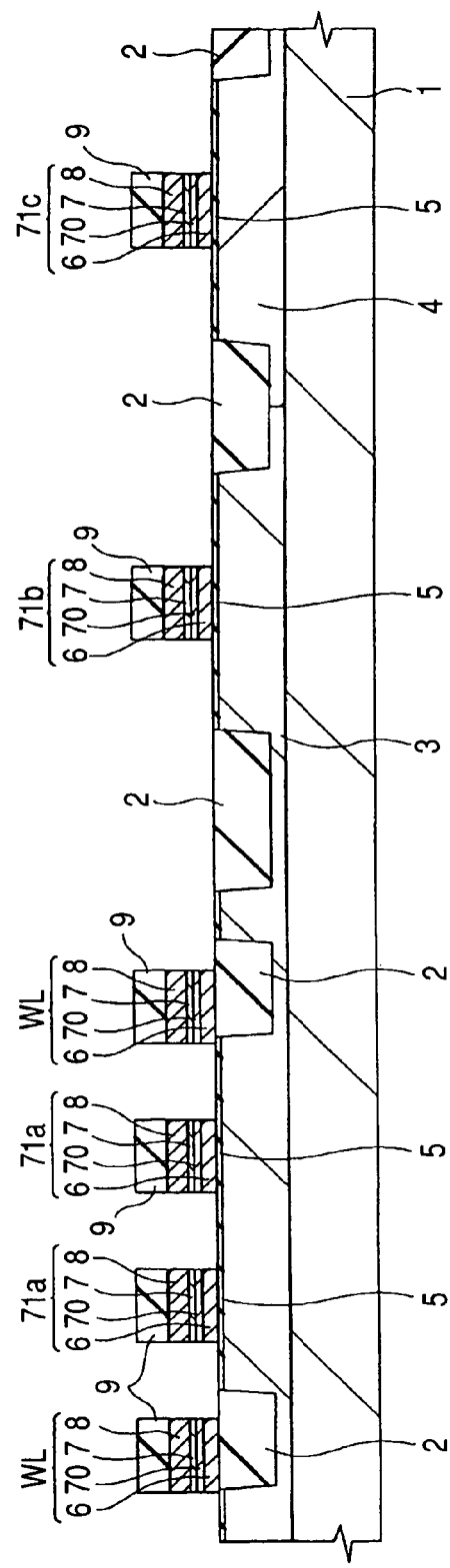

FABRICATION PROCESS OF A SEMICONDUCTOR INTEGRATED CIRCUIT DEVICE

PRIORITY CLAIM

This application claims priority under 35 U.S.C 119 to Japanese patent application P2002-369422 filed Dec. 20, 2002; the entire disclosure of which is hereby incorporated by reference.

FIELD OF THE INVENTION

The present invention relates to a fabrication technique for fabricating a semiconductor device and more particularly to a technique effective for a fabrication of a semiconductor device having a gate electrode at low resistance and capable of enduring a high temperature heat treatment.

BACKGROUND OF THE INVENTION

Along with an increase in the integration degree of semiconductor devices, electrodes and interconnects constituting them have become finer. Since interconnect width is also refined correspondingly, resistance of electrodes and interconnects is increased to make a considerable delay in signals and it has become difficult to design high speed and high performance integrated circuits. Particularly, since polycrystalline silicon used generally for gate electrodes and interconnects of existent MOS (Metal-Oxide-Semiconductor) type semiconductor devices has a relatively high resistance as about 1 mΩ·cm, decreasing the resistance of the electrodes and the interconnects is an important key to attain a high speed and highly integrated circuit. For the lowering of the resistance in the silicon layer, it has been generally studied a technique of vapor depositing titanium and cobalt and reacting the metals only to the electrode interconnect portions in a semiconductor device where silicon is exposed, thereby forming a metal silicide of low resistance, that is, self-aligned silicidation technique has been put to practical use. However, in the interconnects (electrodes) using the silicides, particularly, titanium silicide, when the interconnect width (electrode width) is refined to less than about 0.5 $\mu$m, it results in a problem that the resistance of the silicide layer itself is not lowered as in a case where the interconnect width (electrode width) is large.

Therefore, it has now been under study for gate electrodes and interconnects capable of ensuring stable MOS (transistor) electric characteristics, comparable with those of polycrystalline silicon gate electrodes and interconnects used so far, having lower resistance than silicides and with no increase in the resistivity even when the interconnect width (electrode width) is refined to 0.5 $\mu$m or less.

In recent years, as gate electrodes and interconnects suitable to the purpose described above, it has generally been studied for structures in which a polycrystalline silicon film and a tungsten film are stacked to each other and a barrier layer comprising a nitride of tungsten or titanium is disposed between the metal films and the silicon film. In the structures, since the metal film such as of tungsten scarcely reacts with the underlying silicon layer, gate electrode/interconnect having a low sheet resistance about equal with that of the single metal layer even after the heat treatment can be attained. Due to the effect of the low resistance interconnects (electrodes), high speed operation can be expected for highly integrated circuit semiconductor devices.

Since the silicide reaction does not occur in the stacked structure of the refractory metal layer/barrier layer/silicon layer described above, it has a merit capable of forming electrodes and interconnects by utilizing the low resistivity of the upper refractory metal layer as it is. The laminated film is fabricated into a gate electrode/interconnect pattern, for example, by a dry etching method. In this fabrication step, the gate oxide film present on the surface of the silicon substrate in the vicinity of the electrodes/interconnects are damaged and when a semiconductor device is manufactured in the state as it is, it results in a problem such as deterioration for the break down voltage of the gate insulator film or the long time reliability of the MOS transistor. The situation is identical also in existent gate electrodes/interconnects comprising a single polycrystalline silicon layer. Accordingly, it has generally been adopted to use a method of fabricating into an electrode/interconnect configuration, then removing peripheral silicon oxide film once and forming a clean silicon oxide film again, or repairing defective portions by a heat treatment in an oxidizing atmosphere without removal. The treatment described above is conducted at a high temperature of about 800° C. or higher. However, since the gate electrode of the stacked structure described above has a metal layer such as of tungsten which is readily oxidized or volatilized when exposed to an oxidizing atmosphere, re-oxidation of silicon described above is difficult. Then with a thermodynamical point of view, a heat treatment technique of conducting a heat treatment in an atmosphere where a controlled small amount of water is added to a hydrogen gas thereby capable of selectively oxidizing only the silicon without oxidizing the metals (rather metal oxides are reduced if present) (selective oxidation technology) has been provided and applied for higher reliability of the semiconductor device (refer to Patent Document 1, U.S. Pat. No. 6,197,702).

Further, Patent Document 2, JP-A No. 223439/2000, discloses a technique of nitriding the side wall of a gate electrode before a chemical solution cleaning step applied for removing an organic material (photoresist) adhered on the wafer surface to form a side wall protective film of tungsten nitride, thereby preventing corrosion of the tungsten film with a solution corroding the tungsten film (mixture of sulfuric acid and aqueous hydrogen) (refer to Patent Document 2).

Further, Patent Document 3, JP-A No. 243753/2000, discloses a technique of applying annealing in an $NH_3$ gas atmosphere at 800 to 1150° C. after the patterning step for the gate line, thereby nitriding an exposed portion on the side of the patterned gate line to form a tungsten nitride layer, and preventing abnormal oxidation for the tungsten film (refer to Patent Document 3).

Further, Patent Document 4, JP-A No. 93743/2002, describes a technique of nitriding the surface of a tungsten film for a gate electrode after patterning the gate electrode thereby preventing occurrence of whiskers upon forming the side wall with a silicon nitride to the side wall of the gate electrode (refer to Patent Document 4).

The reliability relevant to the gate insulator film for the MOS transistor or the like has been improved outstandingly by the selective silicon oxidation technology described above (heat treatment in the atmosphere where a controlled small amount of water is added to hydrogen gas) However, according to the study made by the present inventors, an additional problem has been found relating to the heat treatment. That is, when the heat treatment (selective oxidation) is conducted at a temperature of 700° C. or higher, metal such as tungsten is oxidized at the boundary of the stacked structure: Particularly; when the gate electrodes/ interconnects are refined to about 0.2 μm or less, oxidizing species (oxygen or water) diffuse from the side wall of the gate electrode to the boundary between the polycrystalline silicon and the barrier layer, or to the boundary between the barrier layer and the metal layer thereover, so that the contact resistance between the polycrystalline silicon layer and the barrier layer or the metal layer thereover increases in the order of the digit, which results in a problem that high speed operation of the semiconductor device becomes difficult due to the high contact resistance. Further, the oxides are formed on the metal layer surface exposed to the side wall in the fabrication step for gate electrode/interconnects and in the subsequent cleaning step. When selective oxidation is conducted in this state, oxides on the side wall volatilize during the heat treatment process which adhere on the silicon substrate exposed near the electrodes/interconnects or damaged silicon oxides, and metal contaminates intrude into the substrate to bring about a problem of degradation in the charge retention characteristics of the semiconductor device such as a memory, increase of the leak current at the junction layer such as source—drain and, further, deterioration of the dielectric breakdown of the gate insulator film.

Further, the technique for the nitrildation of the gate electrode is adopted for preventing corrosion by chemical solution, preventing abnormal oxidation of the tungsten film or preventing growth of whiskers during formation of the side wall and it does not solve the foregoing problems in view of the selective silicon oxidation technique.

Accordingly, it has been demanded to provide a semiconductor device capable of high speed operation and having high reliability by repairing damages or defects in the silicon oxide films in the vicinity of gate electrodes/interconnects caused in the step such as dry etching avoiding increase in the interlayer contact resistance in the gate electrode of the stacked structure and decreasing contamination to the silicon substrate caused by the metal layer side wall of electrodes/ interconnects.

SUMMARY OF THE INVENTION

The present invention intends to provide a fabrication process for a highly reliable semiconductor device.

The foregoing and other objects and novel features of the invention will become apparent with reference to the descriptions of the specification and the accompanying drawings, although the invention is not limited to the disclosure below.

After patterning a gate electrode containing a metal film or a metal compound film, the side wall of the gate electrode is nitrided or carbonized at a low temperature to form a protective film on the side wall of the metal film and then light oxidation, i.e., an oxidation layer having a small thickness, is applied at a low temperature in order to repair the area around the gate electrode.

BRIEF DESCRIPTION OF THE DRAWINGS

Preferred embodiments of this invention will be described in details based on the drawings, wherein FIG. 1 a cross sectional view for a main portion of a semiconductor device as a preferred embodiment according to the present invention during fabrication steps;

FIG. 2 is a cross sectional view for a main portion of the semiconductor device during fabrication steps succeeding to FIG. 1;

FIG. 3 is a cross sectional view for a main portion of the semiconductor device during fabrication steps succeeding to FIG. 2;

FIG. 7 is a cross sectional view for a main portion of the semiconductor device during fabrication steps succeeding to FIG. 5;

FIG. 8 is a cross sectional view for a main portion of the semiconductor device during fabrication steps succeeding to FIG. 7;

FIG. 19 is a fragmentary enlarged cross sectional view of the semiconductor device as a further embodiment according to the invention during fabrication steps;

FIG. 20 is a cross sectional view for a main portion of the semiconductor device during fabrication steps succeeding to FIG. 19;

DETAILED DESCRIPTION OF THE PREFERRED EMBODIMENTS

Figure 4:
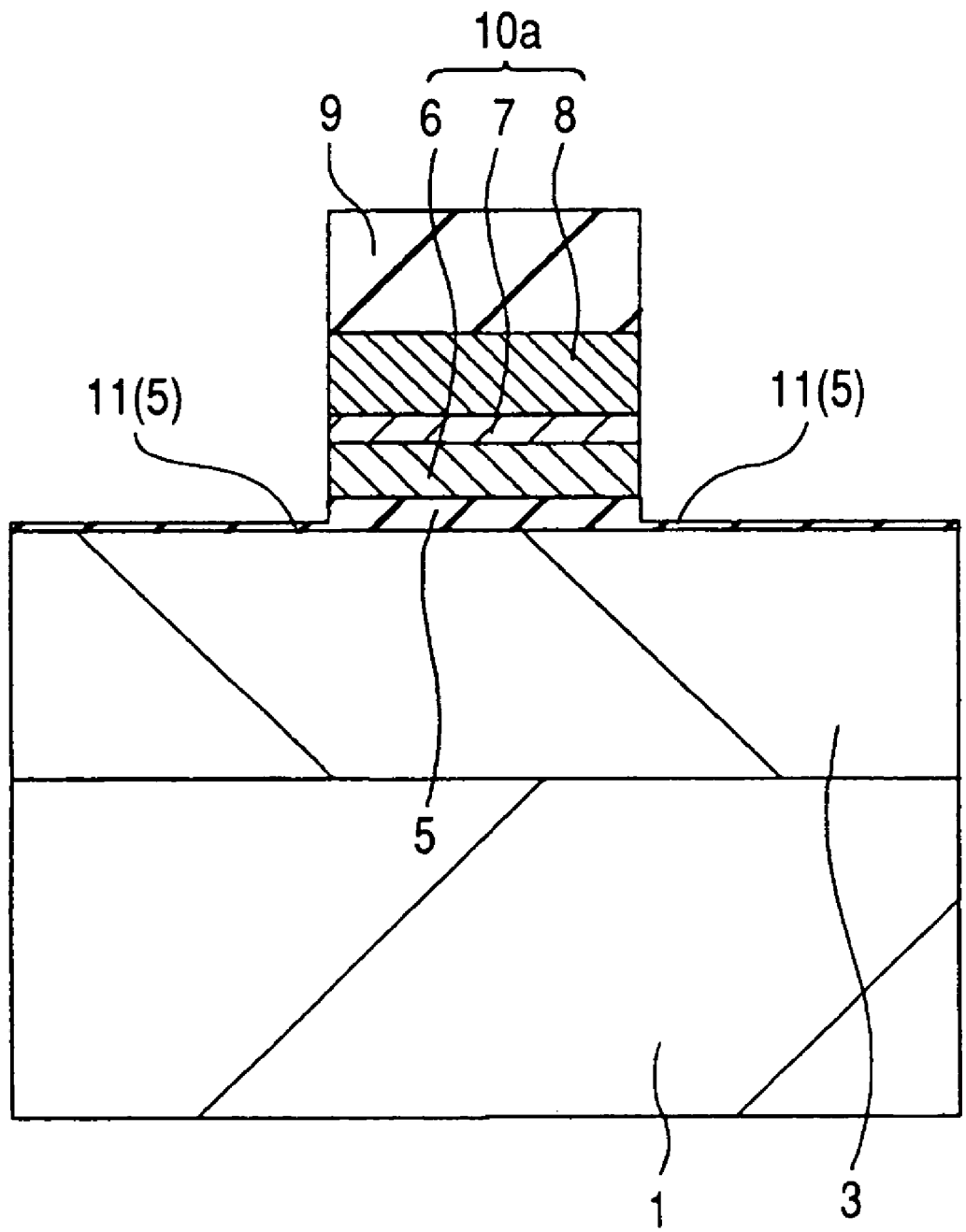
FIG. 4 is a fragmentary enlarged cross sectional view of FIG. 3.

In the following descriptions for the preferred embodiments, description is to be made while dividing them into plural sections or embodiments optionally for the sake of convenience. Unless otherwise indicated, they are related to each other such that one of them is a modified example, details or complementary description for the other of them partially or entirely.

Further, in the following preferred embodiments, when the number of elements (including number, numerical value, amount and range) is referred to, it is not restricted to the specific number thereof but may be more than or less than the specified number except for cases where it is particularly indicated or apparently restricted to the particular number in view of the principle.

Further, in the following preferred embodiments, it will be apparent that the constituent elements thereof (also including elemental step) are not always essential except for cases where they are particularly indicated or considered apparently essential in view of the principle.

In the same manner in the following preferred embodiments, when the shape, and positional relationship for the constituent elements are referred to, they also include those substantially approximate or similar with the shapes except for cases where they are particularly indicated or apparently considered not so in view of the principle. This applies also to the numerical value and the range described above.

Preferred embodiments of the invention will be described in details with reference to the drawings. Throughout the drawings for explaining the preferred embodiments, components having identical functions carry the same reference numerals for which duplicate description is to be omitted. Further, in the drawings used for the preferred embodiments, hatching may sometimes be applied also to plan views and the like for the sake of easy understanding of the drawings. Further,.hatching may sometimes be omitted even for cross sectional views. Further, in the following preferred embodiments, descriptions for identical or similar portions are not repeated in principle except for the case where this is particularly necessary.

(Embodiment 1)

The fabrication process of this embodiment is to be described with reference to the drawings. FIG. 1 to FIG. 13 are cross sectional views, during fabrication steps, for a main portion of a semiconductor device, for example, a DRAM (Dynamic Random Access Memory) memory logic embedded device as a preferred embodiment of the present invention. FIG. 4 corresponds to a fragmentary enlarged cross sectional view of FIG. 3 and FIG. 6 corresponds to a fragmentary enlarged cross sectional view of FIG. 5.

As shown in FIG. 1, a device isolation region 2 is formed to the main surface of a semiconductor substrate (semiconductor wafer) 1 comprising, for example, p-single crystal silicon having a specific resistivity of about 1 to 10 Ωcm. The device isolation region 2 comprises, for example, silicon oxide and is formed, for example, by an STI (Shallow Trench Isolation) method or LOCOS (Local Oxidization of Silicon) method.

Then, a p-type well 3 is formed in a region that forms a memory cell of the semiconductor substrate (memory portion, memory array) and a portion of a peripheral circuit (n-channel type MISFET (Metal Insulator Semiconductor Field Effect Transistor)), and an n-type well 4 is formed in a region for forming another portion of the peripheral circuit (p-channel type MISFET) The p-type well 3 is formed, for example, by ion implanting impurities such as boron (B), and the n-type wells 3 is formed, for example, by ion implanting impurities such as phosphorus (P).

Then, a gate insulator film 5 is formed to the surface of the p-type well 3 and the n-type well 4 (main surface of the semiconductor substrate 1). The gate insulator film 5 comprises, for example, a thin silicon oxide film and can be formed, for example, by a thermal oxidation method. The thickness of the gate insulator film 5 is, for example, about 4 nm.

Then, as shown in FIG. 2, a polycrystalline silicon film 6, for example, of about 50 nm thickness is formed over the entire surface of the semiconductor substrate 1 (that is on the gate insulator film 5), for example, by using a CVD (Chemical Vapor Deposition) method. Then, for the polycrystalline silicon film 6, phosphorus (phosphorus ion) is doped to the polycrystalline silicon film 6 on the p-type well 3, and boron (boron ion) is doped to the polycrystalline silicon film 6 on the n-type well 4, by using an ion implantation method. Phosphorus and boron are ion implanted at a dose, for example, of about $2\times10^{15}/cm^2$ ($2\times10^{15}$ ion/$cm^2$) respectively. Then, a heat treatment is applied in a nitrogen atmosphere, for example, at about 850° C. for 10 sec. Instead of the polycrystalline silicon film 6, an amorphous. silicon film or a single crystal silicon film can also be used. Alternatively, the amorphous silicon film may be formed into the polycrystalline silicon film 6 by a heat treatment or the like after depositing the amorphous silicon film.

Then, a spontaneous oxide film on the surface of the polycrystalline silicon film 6 is removed (removed by cleaning) with a mixed solution of hydrofluoric acid and ammonium fluoride. Then, in order to suppress the spontaneous oxide film formed again on the surface of the polycrystalline silicon film 6 to be as little as possible, the semiconductor substrate 1 is loaded in a vacuum chamber of metal film-forming sputtering equipment having a multi-chamber.

Then, the semiconductor substrate 1 is transferred to the chamber for tungsten sputtering and, after heating, for example, at about 500° C., a tungsten target is sputtered in a mixed gas of argon and nitrogen to deposit a tungsten nitride film 7 over the semiconductor substrate 1 (on polycrystalline silicon film 6). The thickness of the tungsten nitride film 7 to be formed is, for example, about 8 nm. The tungsten nitride film 7 can be deposited under the conditions, for example, at a sputter power of 1 kW, with an argon gas flow rate (flow-in amount) to the sputtering chamber, for example, of 40 cc/min and the nitrogen gas flow rate, for example, of 60 cc/min.

Then, while keeping the sputtering discharge, the argon gas flow rate (flow-in amount) is changed to 100 cc/min and, at the same time, supply of the nitrogen gas is interrupted to deposit metal tungsten over the semiconductor substrate 1. By controlling the discharge time under the state, a tungsten film (metal layer) having a thickness, for example, of about 50 nm is formed on the tungsten nitride (barrier layer) 7.

Then, a silicon nitride film 9 is deposited over the semiconductor substrate 1 (on tungsten film 8) while keeping the semiconductor substrate 1 in a state, for example, at 420° C. by using, for example, a plasma CVD apparatus. The thickness of the silicon nitride film 9 to be formed is, for example, about 160 nm. As other material for the silicon nitride film 9, a silicon oxide film or a silicon carbide film can also be used.

Then, as shown in FIG. 3, the silicon nitride film 9 is removed selectively and patterned to a predetermined shape (fabrication, patterning) by using photolithography and dry etching. Then, a stacked structure of the tungsten film 8, the tungsten nitride film 7 and the polycrystalline silicon film 6 are selectively removed and patterned (fabrication, patterned, dry etching) by using a photoresist pattern or the patterned silicon nitride film 9 as a fabrication mask (etching mask) using, for example, a reactive gas plasma (plasma etching), to form gate electrodes (gate interconnects) 10a, 10b, and 10c. The gate electrode 10a can function as a word line WL of a DRAM memory array.

As shown in FIG. 3 and FIG. 4, each of the formed gate electrodes (gate interconnects) 10a, 10b, and 10c has a stacked structure comprising the polycrystalline silicon film 6, the tungsten nitride film 7, and the tungsten film 8 from below. The tungsten film 8 functions to lower the resistance of the gate electrode. Further, since the sheet resistance, for example, of the gate electrode 14 can be decreased, the word line delay or the like can be reduced. As an alternative material for the tungsten film 8, a refractory metal can be used and, for example, titanium (Ti), tantalum (Ta), or molybdenum (Mo) can also be used. The tungsten nitride film 7 functions as a barrier layer and has a function, for example, of preventing reaction between the tungsten film (metal layer) 8 and the polycrystalline silicon film 6, improvement of adhesion, or anti-diffusion of impurities. For the material of the tungsten nitride film 7 a refractory metal nitride can be used and not only the illustrated tungsten nitride (WNx) but also molybdenum nitride (MoNx), tantalum nitride (TaNx), or titanium nitride (TiNx) (that is, nitride of tungsten, molybdenum, tantalum, or titanium) can also be used. For other material of the tungsten nitride film 7, a refractory metal carbide can also be used and, for example, tungsten carbide (WCx) molybdenum carbide (MoCx), tantalum carbide (TaCx), or titanium carbide (TiCx) (that is, carbide of tungsten, molybdenum, tantalum, or titanium) can also be used.

Usually, for cleaning after the dry etching step, cleaning with an aqueous solution of ammonia and hydrogen peroxide is conducted, followed by etching cleaning with an aqueous hydrofluoric acid solution. However, when hydrogen peroxide is used, the tungsten film 8 may possibly be etched. Further, when the aqueous hydrofluoric acid solution is used, the silicon oxide film over the semiconductor substrate 1 at the periphery of the gate electrodes 10a, 10b, and 10c may possibly be removed by etching (since the film thickness is thin). Accordingly, since it is difficult to apply any of the cleaning methods described above having etching effect, water washing is conducted, for example, for about 20 min in this embodiment. This can prevent etching for the tungsten film 8 and the silicon oxide film.

By the fabrication (dry etching) applied to the gate electrodes 10a, 10b, and 10c, damages or defects are caused to the silicon oxide film 11 present on the surface of the semiconductor substrate at the periphery of the gate electrodes 10a, 10b, and 10c (remaining portions of the gate insulator film 5 other than the portion below the gate electrode). Further, the gate insulator film 5 may possibly be etched to cause undercut also to the lower portion for the side wall of the gate electrodes 10a, 10b, and 10c. This results in disadvantage such as lowering of the break down voltage for the gate insulator film 5. Therefore, it is necessary to apply regrowth of $SiO_2$ around gate electrode (light oxidation) for recovery of the scraped gate insulator film 5 (gate edge recovery). This can restore damages or defects in the silicon oxide film 11 present on the surface of the semiconductor substrate at the periphery of the gate electrodes 10a, 10b, and 10c caused by fabrication (dry etching) for the gate electrodes 10a, 10b and 10c, or recover a clean silicon oxide film to improve the break down voltage of the gate insulator film.

Figure 5:
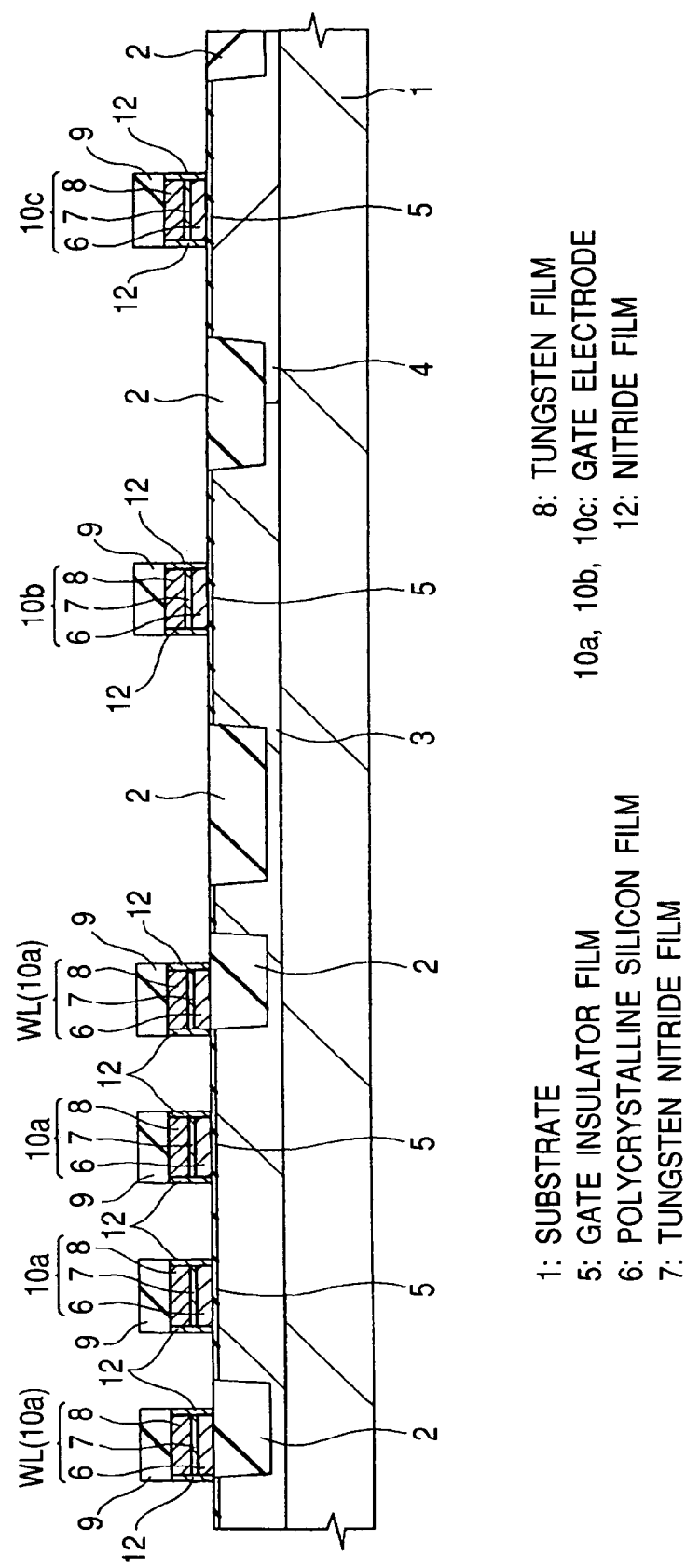
FIG. 5 is a cross sectional view for a main portion of the semiconductor device during fabrication steps succeeding to FIG. 3.
Figure 6:
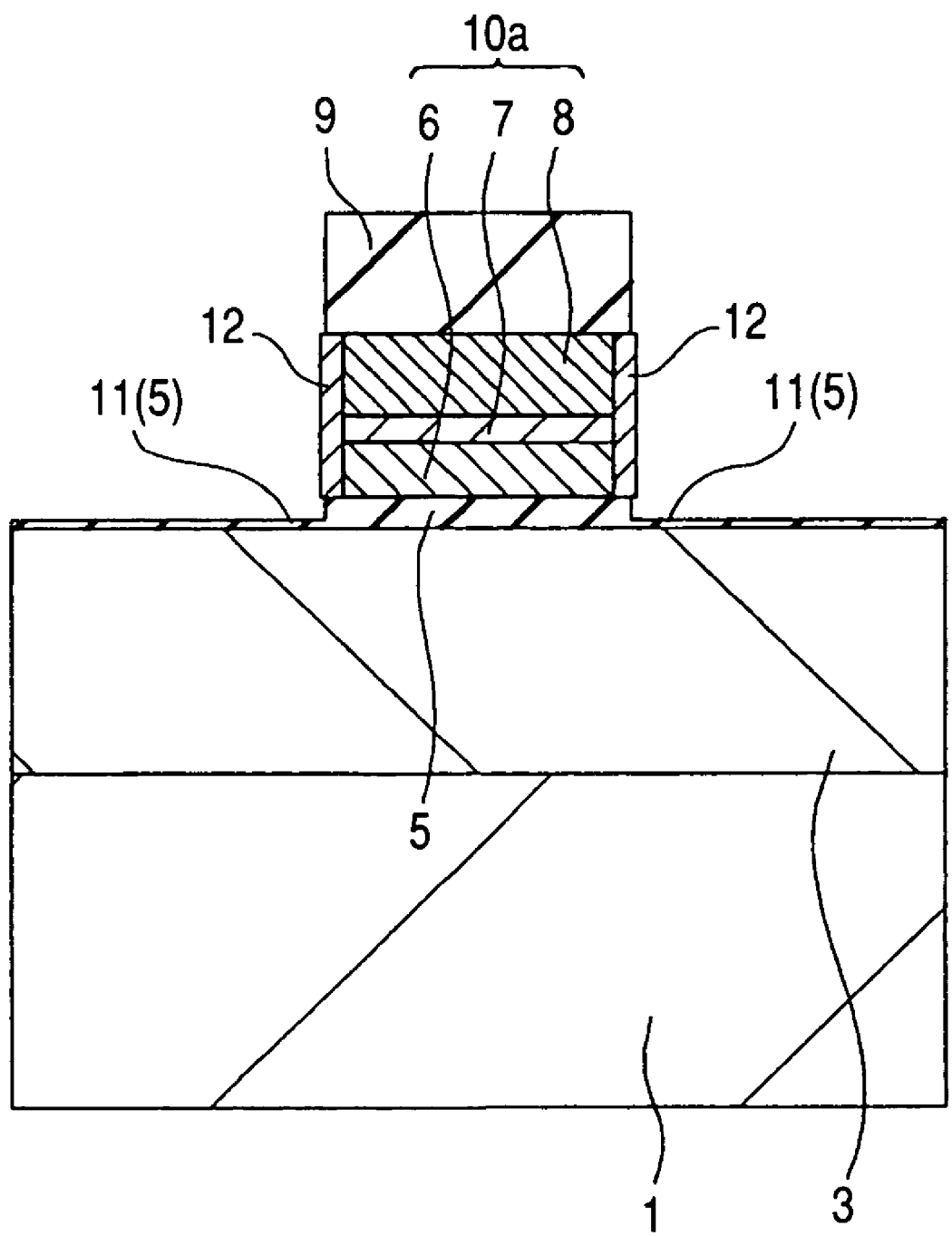
FIG. 6 is a fragmentary enlarged cross sectional view of FIG. 5.

In this embodiment, before the light oxidation described above, a treatment of nitriding the side wall of the gate electrodes 10a, 10b, and 10c (nitriding treatment) is conducted. That is, a plasma treatment using a nitrogen-containing gas (for example, ammonia plasma treatment or nitrogen plasma treatment) is conducted to nitride the side wall for the gate electrodes 10a, 10b, and 10c. For example, the semiconductor substrate 1 is loaded in a plasma chemical vapor deposition apparatus (plasma CVD apparatus) in which an ammonia gas is introduced to generate ammonia plasmas and the side wall for the gate electrodes 10a, 10b, and 10c can be nitrided. When the semiconductor substrate 1 is exposed to the plasmas using the nitrogen-containing gas (for example, ammonia plasma or nitrogen plasma), the side wall for the gate electrodes 10a, 10b, and 10c are nitrided to form a nitride film 12 as shown in FIG. 5 and FIG. 6. The nitridation processing for the side wall of the gate electrodes 10a, 10b, and 10c is conducted at a temperature, preferably, of 600° C. or lower (semiconductor substrate temperature) and, more preferably, at a temperature of 500° C. or lower (semiconductor substrate temperature). Further, since the silicon nitride film 9 is present over the gate electrodes 10a, 10b, and 10c, the upper surface of the gate electrodes 10a, 10b and 10c, that is, the upper surface, of the tungsten film 8 is not nitrided. This can suppress increases in the resistance of the gate electrode.

Further, as will be described later, carbonization processing can also be applied to the side wall of the gate electrodes 10a, 10b, and 10c instead of the nitridation processing for the side wall of the gate electrodes 10a, 10b, and 10c. In this case, a carbide film is formed instead of the nitride film on the side wall of the gate electrodes 10a, 10b, and 10c.

The nitride film 12 formed on the side wall of the gate electrodes 10a, 10b, and 10c comprises silicon nitride on the side of the polycrystalline silicon film 6 and comprises tungsten nitride on the side of the tungsten film 8. Since the tungsten nitride film 7 per se comprises a nitride, it scarcely changes even when exposed to ammonia plasmas. Accordingly, the nitride film 12 is formed substantially on the lateral side (exposed portion) of the polycrystalline silicon film 6 and the tungsten film 8. Further, the thickness of the nitride film 12 may vary actually between the lateral side of the polycrystalline silicon film 6 and the lateral side of the tungsten film 8. However, for easier understanding, it is illustrated in FIG. 5 and succeeding figures that the nitride film 12 is formed at an identical thickness over the entire side wall of the gate electrode (lateral side of the polycrystalline silicon film 6, the tungsten nitride film 7, and the tungsten film 8).

According to the experiment conducted by the present inventor, when the temperature for the semiconductor substrate is excessively high upon nitridation processing (formation of nitride film 12), whiskers (whisker crystals) are grown from the lateral side of the tungsten film 8 of the gate electrodes 10a, 10b and 10c. Under the observation by a scanning type electron microscope, etc., when the nitridation processing is conducted at a temperature for the semiconductor substrate 1, for example, of 700° C. (or higher), the cross sectional shape of the grown whisker is, for example, a square shape and the length thereof is about 0.1 to 0.3 $\mu$m, and a number of such whiskers were grown. As the temperature for the semiconductor substrate 1 upon nitridation processing is higher, whiskers more tend to be grown. When observed more specifically, at a temperature of the semiconductor substrate 1, for example, of about 600° C., growth of micro-fine grains was already observed. As the whiskers grow, reliability of the fabricated semiconductor device is lowered. For example, it may be a worry for the occurrence of short circuit failure such as short circuit between adjacent gate electrodes by the whiskers. Further, the whiskers may possibly constitute the source of contaminates during fabrication process of the semiconductor device. Accordingly, it is necessary to prevent occurrence (growth) of whiskers.

Accordingly, in this embodiment, when the nitride film 12 is formed by nitridation of the side wall for the gate electrodes 10a, 10b, and 10c by ammonia plasmas or the like, it is preferred to control the temperature for the semiconductor substrate 1 to 600° C. or lower as described above. This can suppress or prevent whiskers from growing to improve the reliability of the semiconductor device. Further, when the nitride film 12 is formed by nitridation of the side wall for the gate electrodes 10a, 10b, and 10c by the ammonia plasma. The temperature of the semiconductor substrate is more preferably controlled to 500° C. or lower. This can reliably suppress the growth of the whiskers and also ensure the process margin in the fabrication process. Further, when the nitridation processing is conducted at 500° C. or lower, only the surface of the side wall for the gate electrodes 10a, 10b, and 10c can be nitrided to form a thin nitride film 12 at a good controllability. For example, when the specimen applied with the nitridation processing, for example, at 500° C. or lower was observed by a transmission electron microscope, the thickness of the nitride film (nitride film 12) on the side wall (lateral side) of the tungsten film 8 was, for example, about 1 nm to 3 nm.

Further, when the side wall for the gate electrodes 10a, 10b, and 10c is nitrided by plasmas using a nitrogen-containing gas as in this embodiment, the nitride film 12 can be formed at a lower temperature compared with the case of nitriding the side wall for the gate electrode by annealing in a nitrogen atmosphere. Accordingly, the reliability of the semiconductor device can be improved. Further, when the side wall for the gate electrodes 10a, 10b, and 10c is nitrided by the ammonia plasmas or nitrogen plasma, this is more preferred since the side wall for the gate electrode 10 can be nitrided properly.

Further, the thickness of the nitride film is, more preferably, 2 to 15 nm. This can prevent oxidation at the boundary caused upon light oxidation (for example, boundary between the polycrystalline silicon film 6 and the tungsten nitride film 7, or boundary between the tungsten nitride film 7 and the tungsten film 8) can be prevented and etching for the tungsten caused in a case of using a cleaning liquid containing hydrogen peroxide can be suppressed. Further, formation of tungsten oxide on the side wall of the electrode (gate electrode) caused in a case of using the oxidizing cleaning liquid can be prevented, and growth of spontaneous metal oxides on the side wall (gate electrode side wall) growing during leaving in atmospheric air can be suppressed. Suppression for the formation of such oxides can provide suppressing effect for the volatilization of tungsten oxides in the selective oxidation (light oxidation) step. The effect can improve the charge retention characteristics in a memory or memory embedded device.

After nitridation processing to the side wall for the gate insulator films 10a, 10b, and 10c, oxidation or re-oxidation (light oxidation) processing (oxidation processing for the main surface of the semiconductor substrate 1) is conducted for restoring damages or defects in the silicon oxide film 11 present in the surface portion of the semiconductor substrate at the periphery of the gate electrodes 10, 10b, and 10c caused by fabrication (dry etching) for the gate electrodes 10a, 10b, and 10c or for re-forming a clean silicon oxide film. In this embodiment, light oxidation processing (oxidation processing to the main surface of semiconductor substrate 1) is conducted to the semiconductor substrate 1 using an oxygen-containing gas (for example, oxygen gas or ozone gas). The light oxidation processing (oxidation processing) is conducted, preferably, at a temperature of 600° C. or lower (semiconductor substrate temperature) and, more preferably, at a temperature of 500° C. or lower (semiconductor substrate temperature). Further, the thickness of the silicon oxide film on the semiconductor substrate region at the periphery of the gate electrodes 10a, 10b and 10c after the plasma processing is, for example, about 3.5 nm, which can be controlled by controlling the plasma discharge power, the flow rate of the gas to be introduced and discharge time.

According to the experiment conducted by the present inventor, when the temperature for the semiconductor substrate 1 upon light oxidation processing (oxidation processing for the main surface of semiconductor substrate 1) is excessively high, the nitride film 12 on the surface of the side wall for the gate electrodes 10a, 10b, and 10c is destructed and porous obstacles are grown. It is considered that this is attributable to violent oxidation to the surface on the side wall for the gate electrode 10a; 10b, and 10c (nitride film 12). It has been found that such a phenomenon tends to occur when the temperature for the semiconductor substrate 1 upon light oxidation processing exceeds, for example, about 600° C. When such a phenomenon occurs, it may possibly cause short circuit failure or the like. Further, this may constitute a source for contaminates. Accordingly, it is necessary to prevent such a phenomenon.

Accordingly, when light oxidation processing (oxidation processing) by oxygen plasma is conducted after forming the nitride film 12, it is preferred that the temperature for the semiconductor substrate 1 is controlled to 600° C. or lower or, more preferably, to 500° C. or lower in this embodiment. This can suppress or prevent disadvantages (occurrence of porous obstacles) due to destruction (oxidation) of the nitride film 12. Further, oxidation from the lateral side of the gate electrodes 10a, 10b, and 10c can be prevented more reliably.

Further, in a case where the light oxidation processing (oxidation processing) with oxygen plasma is conducted without forming the nitride film 12, the performance and the reliability of the semiconductor device are deteriorated due to contamination with tungsten volatilized from the side wall for the gate electrodes 10a, 10b, and 10c in the oxidation (light oxidation) process. According to the experiment conducted by the present inventor, when a DRAM was manufactured in accordance with this embodiment and the memory charge retention characteristics thereof were evaluated, it was, for example, at about 250 msec (this is at a level where there is no problem of contamination). However, in the case of a comparative example where the nitride film 12 was not formed, the charge retention characteristics was as short as about 60 msec to 150 msec due the contamination in the semiconductor substrate region with tungsten volatilized from the lateral walls for the gate electrodes 10a, 10b and 10c. Accordingly, when the side wall for the gate electrodes 10a, 10b, and 10c is nitrided to form a nitride film 12 as in this embodiment, volatilization of tungsten from the side wall of the gate electrode 10a, 10b, and 10c can be suppressed or prevented in the subsequent oxidation (light oxidation) process to improve the performance or the reliability of the semiconductor device.

Further, in the light oxidation process conducted after nitridation (or carbonization) on the side wall for the gate electrode, ion products (plasma) caused by electric discharge (plasma discharge) in a processing chamber introduced with an oxygen gas can be irradiated to the surface of the semiconductor substrate 1 (and gate electrodes 10a, 10b, and 10c) to conduct oxidation (light oxidation). By using the ozone gas (conducting plasma processing using ozone gas), since the oxidation speed is increased, the light oxidation processing can be conducted more easily at a low temperature.

Further, according to the experiment conducted by the present inventor, in a case where the light oxidation processing (oxidation processing) described above for restoration of the periphery of the gate electrode was not conducted after the fabrication (dry etching) for the gate electrode, semiconductor devices with the gate break down voltage of MISFET of 7 MV/cm or less were often resulted. However, in a case where the light oxidation processing (oxidation processing) is applied to oxidize the semiconductor substrate region at the periphery of the gate electrodes 10a, 10b, and 10c as in this embodiment, the gate break down voltage of MISFET is improved and failed semiconductor devices are scarcely resulted. Accordingly, light oxidation processing (oxidation processing) as in this embodiment can improve the reliability of the semiconductor device.

Further, oxidation of metals such as tungsten proceeds rapidly by a heat treatment at a high temperature of about 500° C. or higher. Further, volatilization of oxides of metals such as tungsten (tungsten oxide) present on the surface of the metal layer becomes remarkable from the temperature region at about identical level. Accordingly, it may be considered to conduct selective oxidation of silicon in an atmosphere where a controlled small amount of water is added to a hydrogen gas. However, it is difficult to conduct the selective oxidation at a low temperature of about 500° C. or lower. This is because the amount of water added to enable selective oxidation of silicon is as at a level of several hundreds ppm or less, and this makes the control of the addition amount difficult and the oxidation rate of silicon so slow as not reaching a practical level for the fabrication of the semiconductor device.

Accordingly, in this embodiment, oxidation (light oxidation) processing after the fabrication of the gate electrode is conducted in an atmosphere where the oxygen plasma is activated to enable oxidation of silicon at a low temperature of several hundreds degrees (° C.). This enables to conduct light oxidation, processing (oxidation processing) at a relatively low temperature. The thickness of the silicon oxide film formed by light oxidation processing (oxidation processing) after fabrication of the gate electrode may be, for example, at about 2 nm to 4 nm. For suppressing volatilization of metal oxides present on the surface of the metal layer as much as possible in the course of oxidation (light oxidation), the temperature for the semiconductor substrate is controlled to a temperature, preferably, of about 600° C. or lower and, more preferably, about 500° C. or lower. In the course of the oxidation (light oxidation), when a metal layer or a barrier layer is present being exposed on the side wall of the gate electrode, it can be oxidized in the same manner as silicon of a semiconductor substrate region at the periphery of the gate electrode. The layer (metal layer or barrier layer) may sometimes be oxidized more readily than silicon, but oxidation of the metal layer or the barrier layer of the gate electrode can be suppressed or prevented by nitriding (or carbonizing) the surface on the side wall of the metal layer and/or barrier layer of the gate electrode in this embodiment. Since the nitridation (or carbonization) for the side wall of the metal layer and/or barrier layer of the gate electrode proceeds more rapidly than in the semiconductor substrate (silicon substrate) region, the thickness of the silicon nitride film 12 (or carbide film) on the side wall of the gate electrodes 10a, 10b, and 10c is larger than that of the silicon nitride film (or silicon carbide film) formed over the semiconductor substrate 1. By utilizing the difference in the thickness of the compound, it is possible to suppress oxidation of the metal layer or the barrier layer of the gate electrodes 10a, 10b, and 10c that proceeds during oxidation of silicon near the end of the gate electrodes 10a, 10b, and 10c over the semiconductor substrate (silicon substrate) 1 and suppress volatilization of metal oxides in the oxidation step or the subsequent thermal step (heating step, heat treatment step) thereby suppressing or preventing degradation of the reliability of the semiconductor device. As described above, volatilization of the metal oxide can be controlled more effectively by conducting the oxidation step at a low temperature of 600° C. or lower and, more preferably, 500° C. or lower.

Further, when a desired patterned shape is formed for the gate electrodes 10a, 10b, and 10c by dry etching (patterning), it is more preferred to control the dry etching so as to entirely or partially leave the thickness of the gate insulator film 5 present below a portion of the gate electrode-forming stacked structure removed by etching (polycrystalline silicon film 6, tungsten nitride film 7 and tungsten film 8). Thus, after completion of the dry etching step for forming the gate electrodes 10a, 10b, and 10c, the silicon oxide film 11 remains over the semiconductor substrate region at the periphery of the electrodes 10a, 10b, and 10c. For example, the etching end for the gate electrode-forming stacked structure (crystal silicon film 6, tungsten nitride film 7 and tungsten film 8) is monitored and discharge for etching is stopped with no delay at the end of the fabrication (etching) for the gate electrodes 10a, 10b, and 10c, so that the gate insulator film 5 in the region other than that below the gate electrodes 10a, 10b, and 10c is not completely removed. The remaining silicon oxide film 11 has an effect of suppressing the silicon region of the semiconductor substrate 1 from nitridation upon nitridation for the side wall of the gate electrodes 10a, 10b, and 10c.

Further, instead of nitriding the side wall for the gate electrode by plasma processing using the nitrogen-containing gas, it may be considered to deposit the silicon nitride film on the side wall for the gate electrode. In this case, it is necessary to deposit the silicon nitride film to a relatively large thickness in order to prevent the volatilization of tungsten or the like from the side wall of the gate electrode in the light oxidation step. However, this is disadvantageous for refinement. In this embodiment, since the side wall of the gate electrode is nitrided by the plasma processing using the nitrogen-containing gas and the side wall of the gate electrode itself forms the nitride, this is advantage for refinement. Furthermore, since the side wall of the gate electrode per se forms the nitride, progress of oxidation from the boundary between each of the layers constituting the gate electrode of the multi-layered structure can be suppressed in the light oxidation step and volatilization of tungsten can be prevented.

Further, in this embodiment, plasma processing using the nitrogen-containing gas (for example, nitrogen plasma processing or ammonia plasma processing) is conducted to nitride the side wall for the gate electrodes 10a, 10b, and 10c after the fabrication of the gate electrode and before the light oxidation processing. In other embodiment, plasma processing using a carbon-containing gas (for example, plasma processing using methane gas) may also be conducted to carbonize the side wall for the gate electrodes 10a, 10b, and 10c after fabrication of the gate electrode and before conduction of light oxidation processing. Carbonization processing to the side wall for the gate electrodes 10a, 10b, and 10c can be conducted, for example, by a plasma processing using a carbon-containing gas, for example, a methane gas or carbon monoxide (CO) gas. Also in the plasma processing for carbonization, like plasma processing for nitridation, it is conducted at a temperature for the semiconductor substrate of 600° C. or lower, more preferably, 500° C. or lower. While a refractory metal such as tungsten tends to be carbonized and the entire metal layer (for example, tungsten film 8) denatures into a metal carbide when carbonization processing is conducted at a temperature higher than that described above, such problem can be avoided by the temperature control described above. Further, in addition to the plasma processing, side wall for the gate electrodes 10a, 10b, and 10c over the semiconductor substrate 1 can also be carbonized, for example, by a heat treatment in a carbon-containing atmosphere, or a heat treatment by locating a carbon piece and the semiconductor substrate 1 in one identical furnace (vacuum furnace) thereby volatilizing carbon from the carbon piece. With the carbonization processing, a carbide film is formed instead of the nitride film 12 on the side wall for the gate electrodes 10a, 10b, and 10c. The carbide film comprises silicon carbide on the lateral side of the polycrystalline silicon film 6, comprises tungsten carbide on the lateral surface of the tungsten film 8, and is not formed or comprises tungsten nitride carbide (or tungsten carbide) on the lateral surface of the tungsten nitride film 7. By conducting the carbonization processing on the side wall for the gate electrode before light oxidation substantially the same effect as that by nitridation processing on the side wall for the gate electrode before light oxidation can be obtained, volatilization of tungsten from the side wall for the gate electrode in the light oxidation step can be suppressed or prevented to improve the performance and the reliability of the semiconductor device.

Further, in a case of conducting the carbonization processing on the side wall for the gate electrode before light oxidation, carbide can be formed on the side wall for the gate electrode at a relatively low temperature to facilitate carbonization processing. Accordingly, this facilitates control for the fabrication process. Further, tungsten carbide thus formed is stable and highly resistant to chemicals.

Further, when the nitridation processing is conducted on the side wall for the gate electrode before light oxidation, since nitrogen used for the nitridation processing less intrudes as contamination or impurity into the semiconductor substrate, and gives scarce effect on the device characteristics, the yield of the semiconductor devices to be fabricated can be improved further.

Further, light oxidation, processing can also be conducted following the carbonization processing after the nitridation processing on the side wall for the gate electrode. Further, light oxidation processing can be conducted following the nitridation processing after the carbonization processing on the side wall for the gate electrode. Further, before the light oxidation processing, nitridation and carbonization can be proceeded simultaneously on the side wall for the gate electrode in an atmosphere containing both an atmosphere for the nitridation processing (for example, nitrogen plasma or ammonia plasma) and an atmosphere for the carbonization processing (for example, carbon monoxide plasma or methane plasma).

Steps subsequent to the light oxidation processing (oxidation processing) step are described below. At first, as shown in FIG. 7, impurities such as boron (B) are ion implanted into the n-type well 4 to form a $p^-$-type semiconductor region 14 on both sides of the gate electrode 10c for the n-type well 4. Further, impurities such as phosphorus (P) are ion implanted to the p-type well 3 thereby forming an $n^-$-type semiconductor region 15 in the region on both sides of the gate electrode 10b for the p-type well 3, and forming an n-type semiconductor region 16 in the region on both sides of the gate electrode 10a for the p-type well 3.

Then, a silicon nitride film 17 is formed over the semiconductor substrate 1 by using a CVD method or the like. Then, the memory portion is covered with a photoresist film not illustrated and the silicon nitride film 17 in the peripheral circuit portion is anisotropically etched to form side wall spacer or side wall 18 comprising the silicon nitride film 17 remaining on the side wall for the gate electrodes 10b and 10c.

Then, impurities such as phosphorus (P) or arsenic (As) are implanted into the p-type well 3 in the peripheral circuit portion thereby forming an $n^+$-type semiconductor region 19 (source—drain) at high impurity concentration in the region on both sides of the gate electrode 10b and the side wall 18 of the p-type well 3 (formed). Further, impurities such as boron (B) are ion implanted into the n-type well 4 in the peripheral circuit portion thereby forming $p^+$-type semiconductor region 20 (source•drain) at high impurity concentration in the region on both sides of the gate electrode 10c and the side wall 18 in the n-type well 4. The structure shown in FIG. 8 is thus obtained.

As described above, a memory cell selecting MISFET 21 is formed in the memory portion, an n-channel type MISFET 22 is formed in the p-type well 3 in the peripheral circuit portion, and a p-channel MISFET 23 is formed in the n-type well 4 in the peripheral circuit portion.

Figure 9:
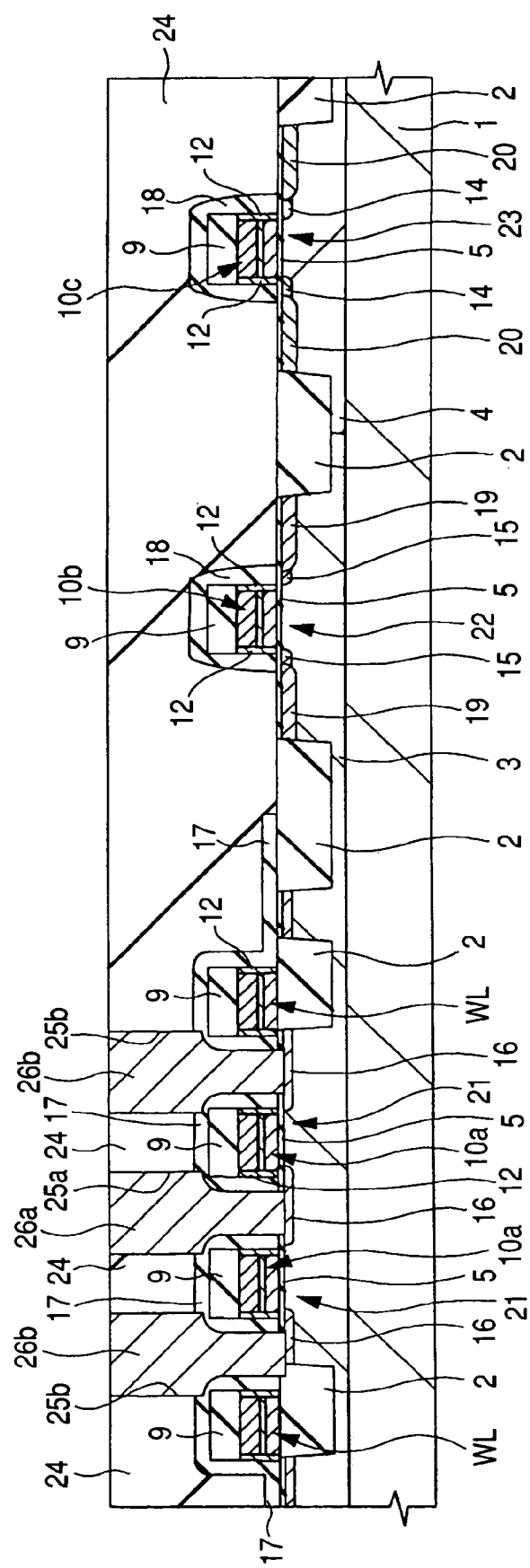
FIG. 9 is a cross sectional view for a main portion of the semiconductor device during fabrication steps succeeding to FIG. 8.

Then, as shown in FIG. 9, a silicon oxide film 24 is formed over the semiconductor substrate 1 by using a CVD method or the like and the upper surface thereto is planarized by using, for example, a CMP (Chemical Mechanical Polishing) method. Then, contact holes 25a and 25b for exposing the n-type semiconductor region 16 (source—drain) for the memory cell selecting MISFET 21 are formed in the silicon oxide film 24 by using a photoresist method and a dry etching method. For example, by using a self-aligned contact (SAC) process, dry etching is at first conducted under the condition where the silicon oxide film is etched easily to remove the silicon oxide film 24 and then dry etching is conducted under the condition where silicon nitride is etched easily to remove the silicon nitride film 17 (and silicon oxide film therebelow), thereby forming the contact holes 25a, and 25b. In this case, the silicon nitride film 17 is remained on the side wall for the gate electrode 10a.

Then, a polycrystalline silicon doped with phosphorus or the like (doped polycrystalline silicon) film is formed over the semiconductor substrate 1 so as to bury the contact holes 25a and 25b, for example, by a CVD method, and the doped polycrystalline silicon film is polished by the CMP method or the like to form plugs 26a and 26b burying the contact holes 25a and 25b. Impurities in the plugs 26a and 26b (phosphorus in this case) are diffused in the n-type semiconductor region 16 (source•drain) by the subsequent high temperature process to increase the impurity concentration and lower the resistance of the n-type semiconductor region 16.

Figure 10:
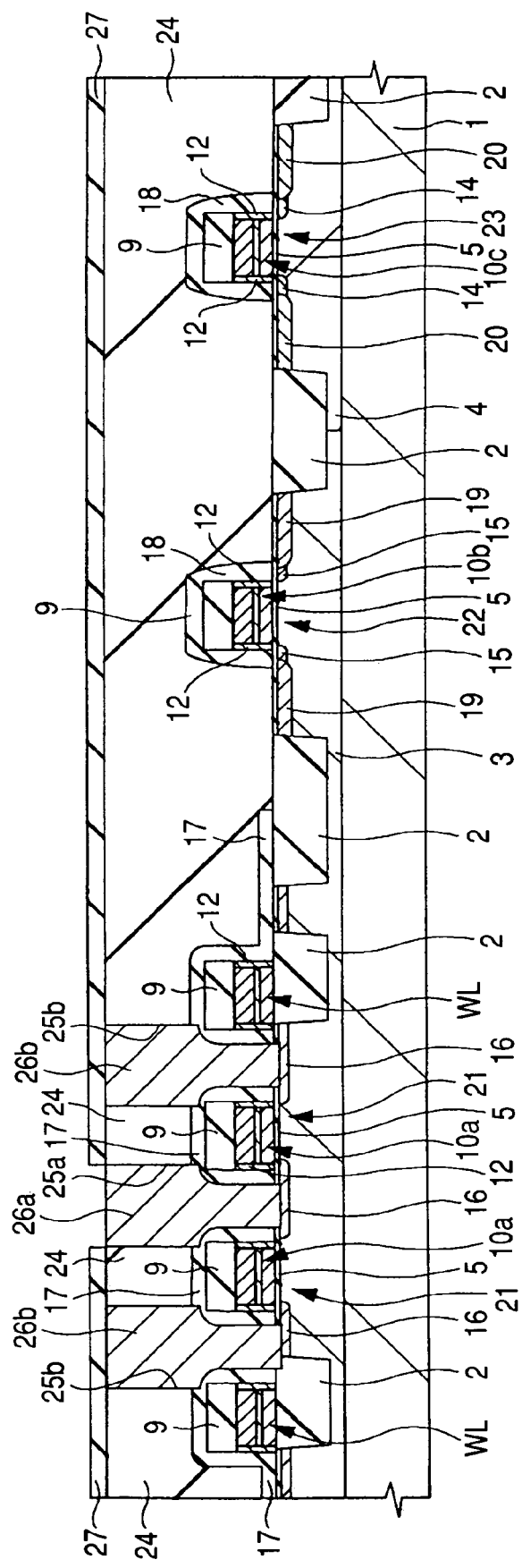
FIG. 10 is a cross sectional view for a main portion of the semiconductor device during fabrication steps succeeding to FIG. 9.

Then, as shown in FIG. 10, a silicon oxide film 27 is formed on the silicon oxide film 25 in which the plugs 26a and 26b are buried by the CVD method or the like. Then, the silicon oxide film 27 over the plugs 26a is selectively removed by using a photoresist method and a dry etching method.

Figure 11:
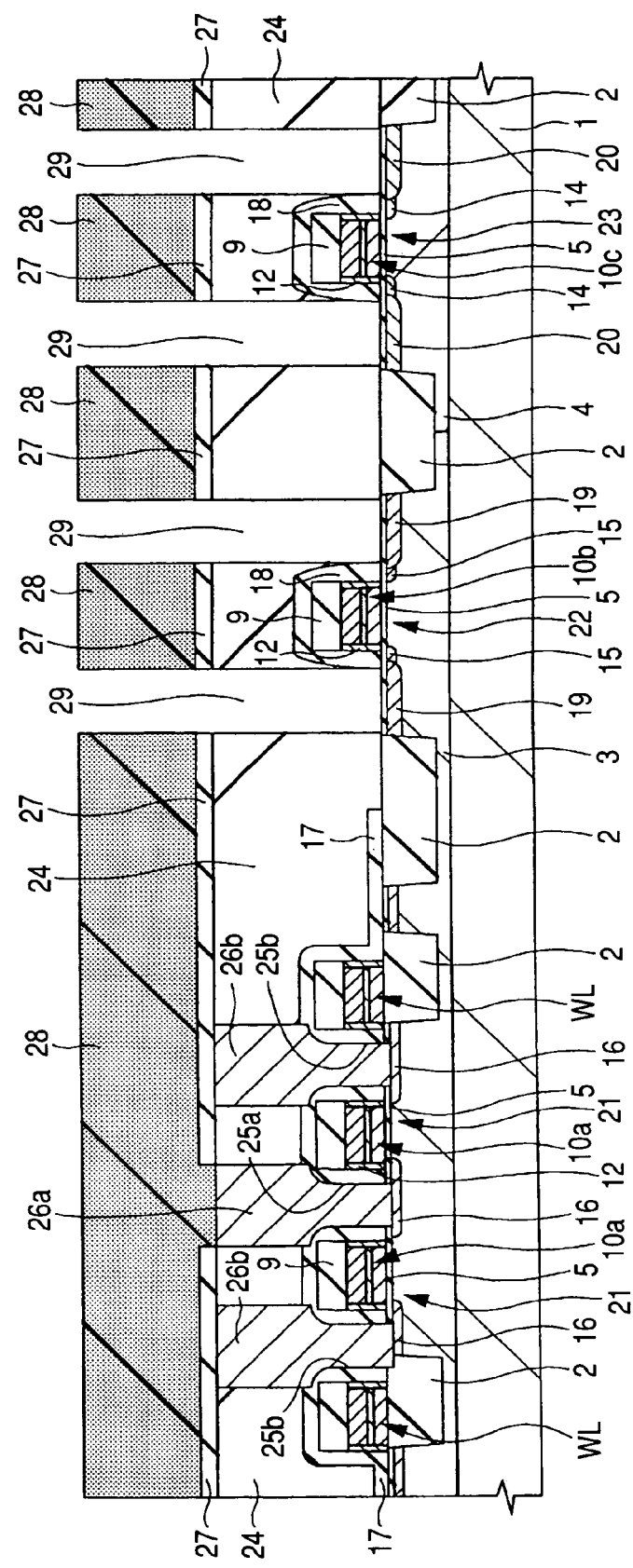
FIG. 11 is a cross sectional view for a main portion of the semiconductor device during fabrication steps succeeding to FIG. 10.

Then, as shown in FIG. 11, a photoresist pattern 28 is formed over the semiconductor substrate 1 (on the silicon oxide film 27), the silicon oxide film 28 and the silicon oxide film 25 (and thin silicon oxide film therebelow) are selectively removed in the peripheral circuit portion by dry etching using the photoresist pattern 28 as an etching mask to form contact holes 29. At the bottom of the contact holes 29, the n+-type semiconductor region 19 and the p+-type semiconductor region 20 as the source—drain and the gate electrodes 10b, 10c of the MISFETs 22 and 23 are exposed.

Figure 12:
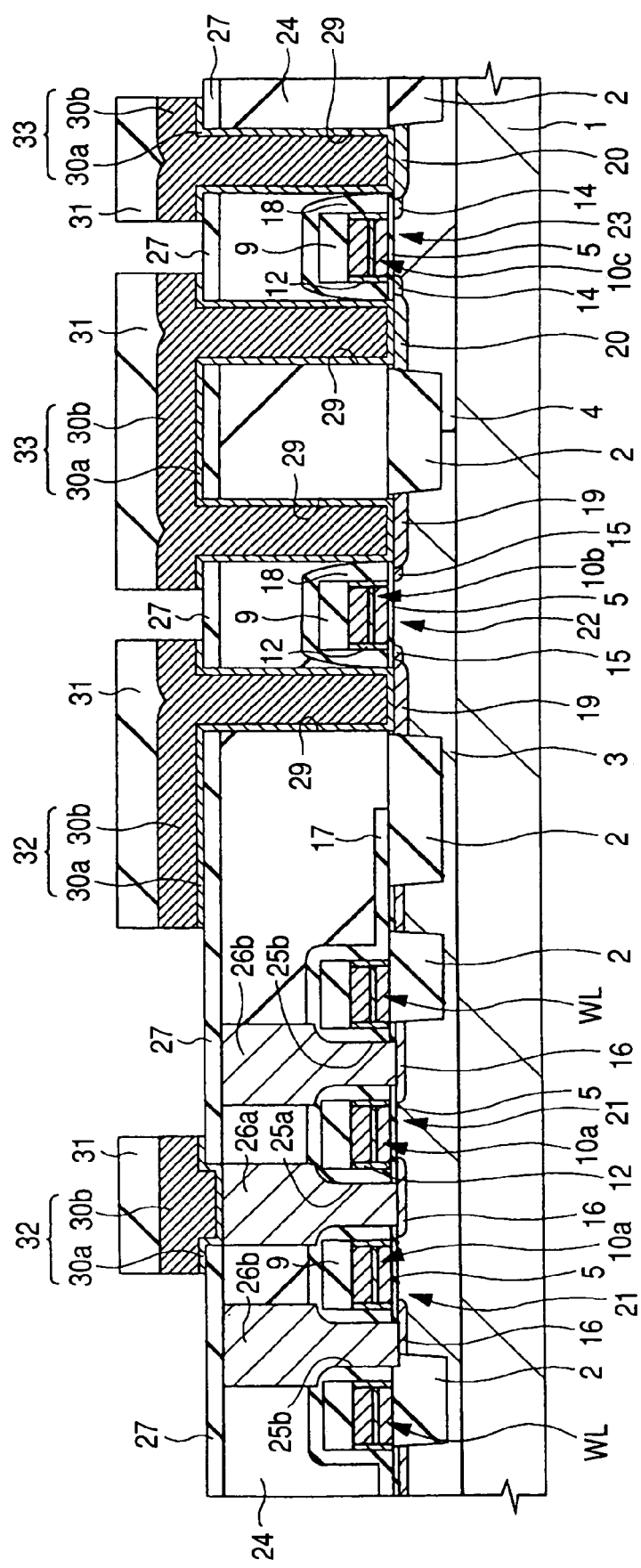
FIG. 12 is a cross sectional view for a main portion of the semiconductor device during fabrication steps succeeding to FIG. 11.

Then, as shown in FIG. 12, a titanium nitride film 30a and the tungsten film 30b are formed over the semiconductor substrate 1a by a sputtering method and, further, a silicon oxide film 31 is formed thereon by a CVD method, and patterned by using a photoresist method and a dry etching method to form bit lines 32 in the memory portion and first layer interconnects 33 in the peripheral circuit.

Figure 13:
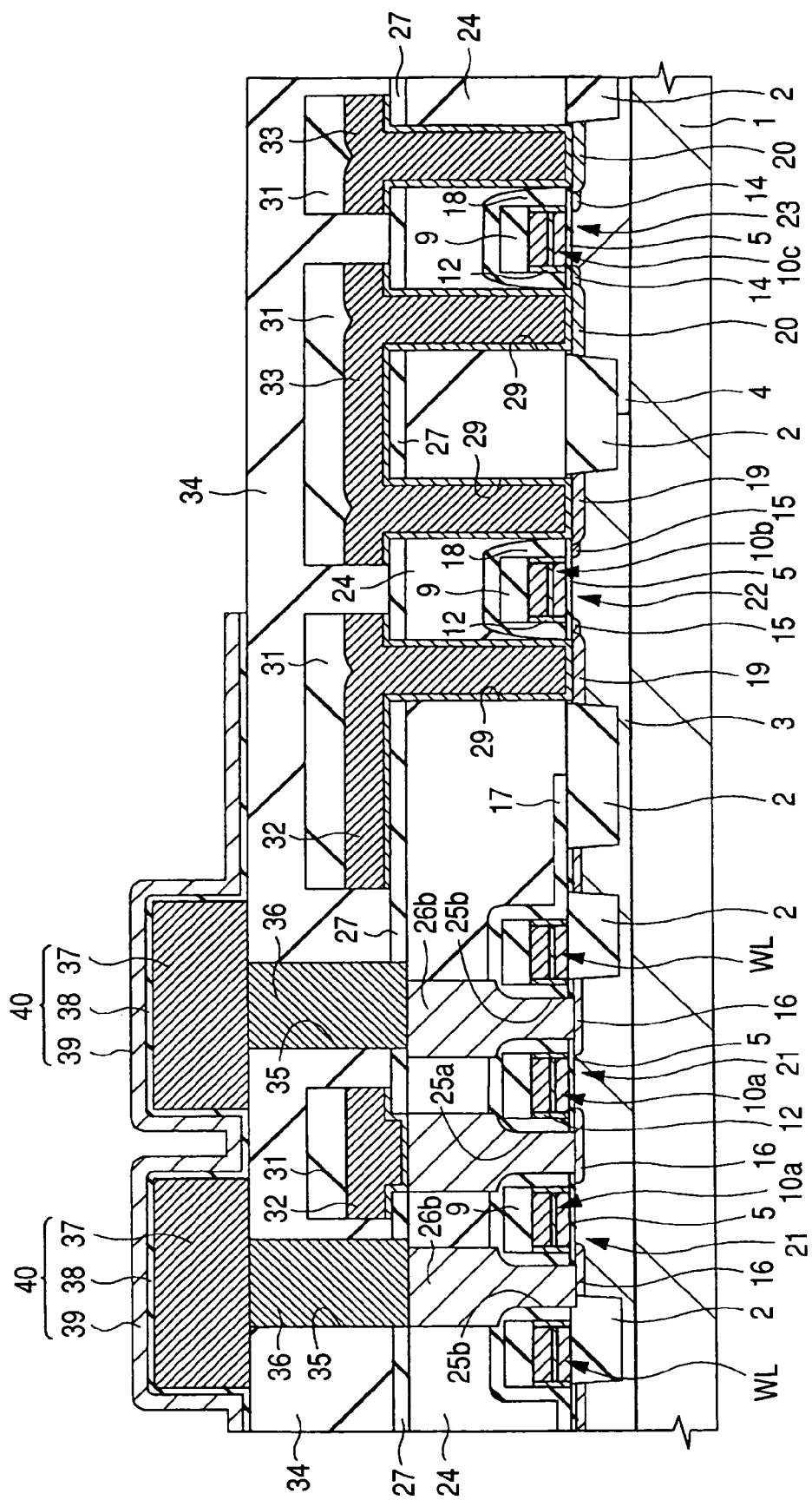
FIG. 13 is a cross sectional view for a main portion of the semiconductor device during fabrication steps succeeding to FIG. 12.

Then, as shown in FIG. 13, a silicon oxide film 34 is formed over the semiconductor substrate 1 so as to cover the bit lines 32 and the first layer interconnects 33, for example, by a CVD method. Then, the silicon oxide film 34 and the silicon oxide film 27 are removed selectively by using a photoresist method and a dry etching method to form via holes or through holes 35 for exposing the plugs 26b. Then, a tungsten film is formed over the silicon oxide film 34 so as to bury the through holes 35 by using a sputtering method and polished by a CMP method to form plugs 36 for burying the through holes.35.

Then, information storage capacitor elements 40 constituted with a stacked structure of a lower electrode 33, a capacitor dielectric film 38 and an upper electrode 39 are formed above the plugs 36 to, substantially complete memory cells of DRAM constituted with the memory cell selecting MISFETs 21 and the information storage capacitor elements 40 connected in series therewith. The lower electrode 37 of the information storage capacitor element 40 can be formed, for example, by forming a tungsten film over the silicon oxide film 34 by a sputtering method or a CVD method and patterning the tungsten film by using a photoresist method or a dry etching method. The capacitor dielectric film 38 and the upper electrode 39 can be formed, for example, by forming a tantalum oxide film (insulation film for capacitor dielectric film 38) and a titanium nitride film (conductive film for upper electrode 39) over the silicon oxide film 34 so as to cover the lower electrode 37 and patterning the titanium nitride film and the tantalum oxide film by using a photoresist method and a dry etching method. Subsequently, aluminum interconnects, etc. are formed optionally above the information storage capacitor elements 40, but description and illustration of them are omitted.

As described above, an actual memory—logic embedded semiconductor device (DRAM) was manufactured and the effect of the invention was confirmed in view of the shape and electric characteristics of the circuit thereof. However, since the amount volatilizing from the side wall of the metal layer (tungsten film 8) for the gate electrode (gate interconnect) by the oxidation (light oxidation) process is small, it is not easy to evaluate the volatilization amount by a usual analysis method. Accordingly, the following experiment was conducted. That is, a tungsten film was formed over an entire semiconductor wafer (semiconductor substrate) and the amount of volatilized tungsten in a case of applying the concept of this embodiment was evaluated in this state.

Figure 14:
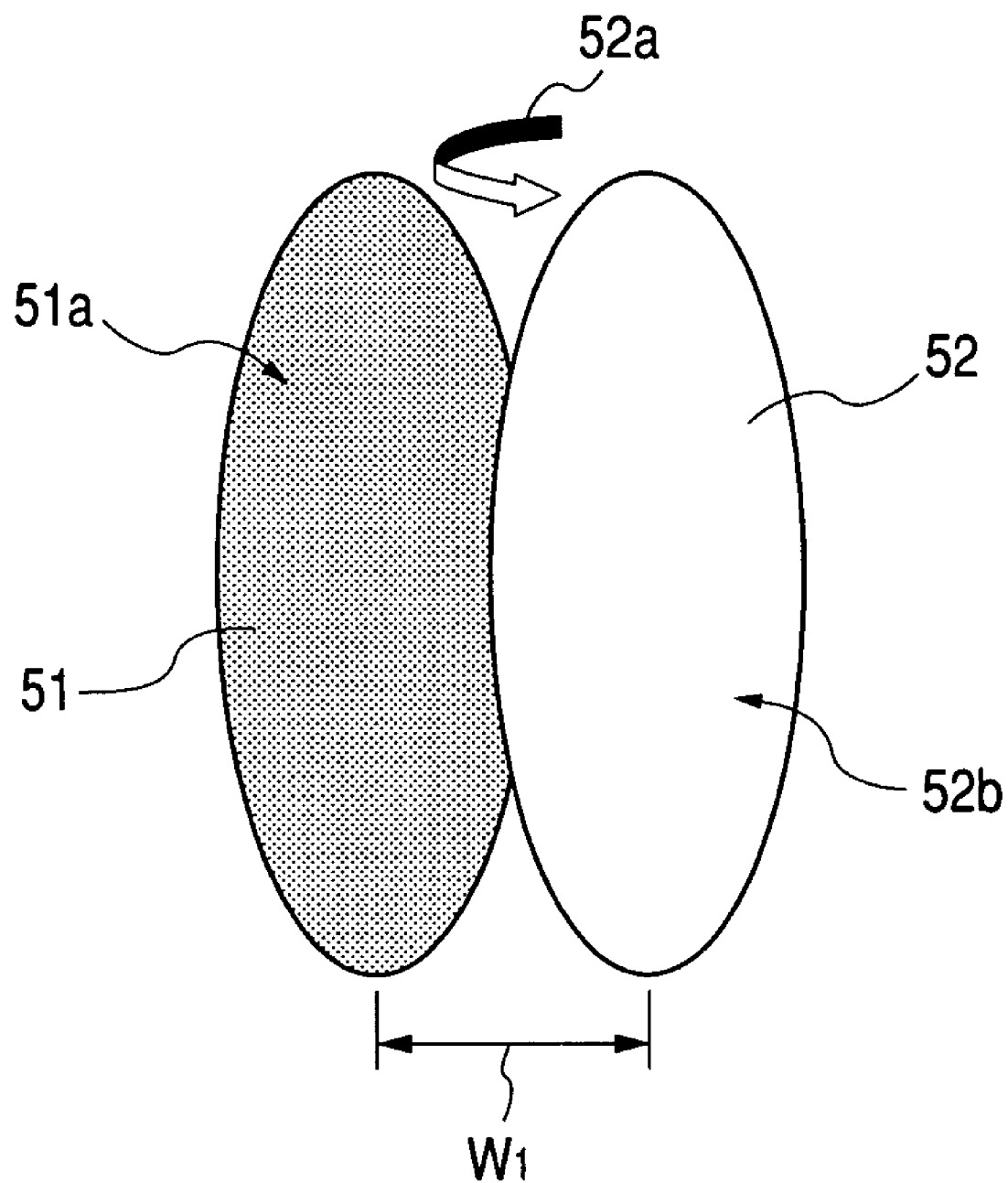
FIG. 14 is an explanatory view for an experiment conducted for examination of a contamination amount.
Figure 15:
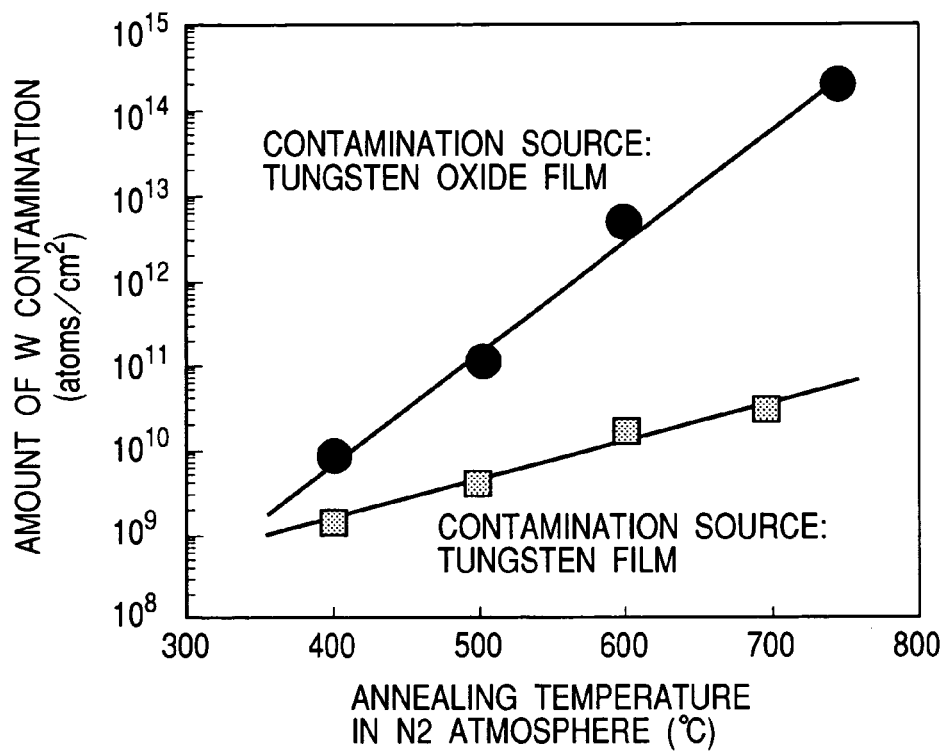
FIG. 15 is a graph showing the amount of tungsten volatilizing from a contamination source specimen and adhering on the surface of cleaned wafer.

In this experiment, two kinds of specimens were prepared as a contamination source specimen 51, that is, a specimen prepared by forming a tungsten film over the entire surface of a semiconductor wafer and oxidizing the surface of the tungsten film so as to promote volatilization (tungsten oxide constituting a contamination source) and a specimen not oxidizing the tungsten film (tungsten constituting a contamination source). FIG. 14 is an explanatory view for the experiment conducted for examining the amount of contamination. A clean wafer (clean semiconductor wafer, silicon wafer) 52 was opposed to the contamination source specimen 51 as shown in FIG. 14. They are located such that the contamination source surface (tungsten oxide film surface or tungsten film surface) 51a of the contamination source specimen 51 and a clean surface (contamination evaluation surface) 52a of the clean wafer 52 were opposed to each other. The clean surface (contamination evaluation surface) 52a of the clean wafer 52 is a main surface opposite to the surface 52b, on which a semiconductor device can be formed. A heat treatment was applied on every 10° C. temperature step within a temperature range from 200° C. to 800° C. in a nitrogen atmosphere (with no plasma discharge) at a constant distance $W_1$ of 5 mm between the specimens (clean wafer 52 and contamination specimen 51). The heat treatment time at each step of temperature was constant as 10 min. Total reflection X-ray fluorescence analysis was conducted for the surface of the clean wafer (clean semiconductor wafer) treated at each temperature, and the amount of tungsten volatilizing from the contamination source specimen by the heat treatment and adhering on the surface of the clean wafer was determined. FIG. 15 shows the result of measurement. FIG. 15 is a graph showing the amount of tungsten volatilizing from the contamination source specimen by the heat treatment and adhering on the surface of the clean wafer, in which abscissa corresponds to the heat treatment temperature in the nitrogen atmosphere and the ordinate corresponds to the amount of tungsten adhering on the clean wafer. As shown in the graph of FIG. 15, it was found that tungsten was adhered on the clean wafer by an amount of one digit or more in a case of tungsten where the contamination source (contamination source specimen) was oxidized than in a case where it was not oxidized (tungsten constituting contamination source).

Then, when a polycrystalline silicon gate DRAM was located instead of the clean wafer, identical heat treatment was conducted and the memory charge retention characteristics of the DRAM depending on tungsten contamination was evaluated. Although it was difficult to define generally depending on the technical node, the circuit system or the fabrication process conditions for the memory used, degradation in the memory retention time by volatilized tungsten was not remarkable in a case of opposing the not-oxidized tungsten. On other hand, in a case where oxidized tungsten was opposed, deterioration became remarkable by a heat treatment about at 600° C. or higher. Accordingly, upon estimation in comparison with the result of graph in FIG. 15, it is considered that the amount of contamination at about a level of a $10^{10}/cm^2$ or less gives no problem in the use of the memory under the condition of experimental arrangement as shown in FIG. 14.

After the preliminary experiment as described above, a specimen was prepared by nitriding the surface of the tungsten film formed over the entire surface of the semiconductor wafer under the same conditions as those for the nitriding conditions on the side wall for the gate electrodes 10a, 10b, and 10c in the fabrication steps of this embodiment described above (contamination source specimen) and a specimen prepared by forming a not nitrided or oxidized tungsten film over the semiconductor wafer (contamination source specimen) were arranged to the clean wafer as shown in FIG. 14, and a heat treatment was conducted in this case in a plasma oxygen plasma atmosphere (oxygen plasma atmosphere)

Further, a silicon wafer formed with nothings was treated under the same conditions for the tungsten nitridation conditions described above. This is because the silicon substrate at the periphery of the gate electrode (gate interconnect) may also possibly be nitrided in a case of actually fabricating the semiconductor device, which may possibly suppress oxidation of the silicon substrate in the plasma oxidation process. A preliminarily study was conducted for the oxidizing conditions for silicon by using the wafer applied with such a treatment. The heat treatment was conducted on every 100° C. step from 200° C. to 800° C. The plasma power and the processing time at each temperature were determined so as to provide a condition of forming a silicon oxide film of 4 nm thickness on the surface of the silicon substrate determined by previous study.

Figure 16:
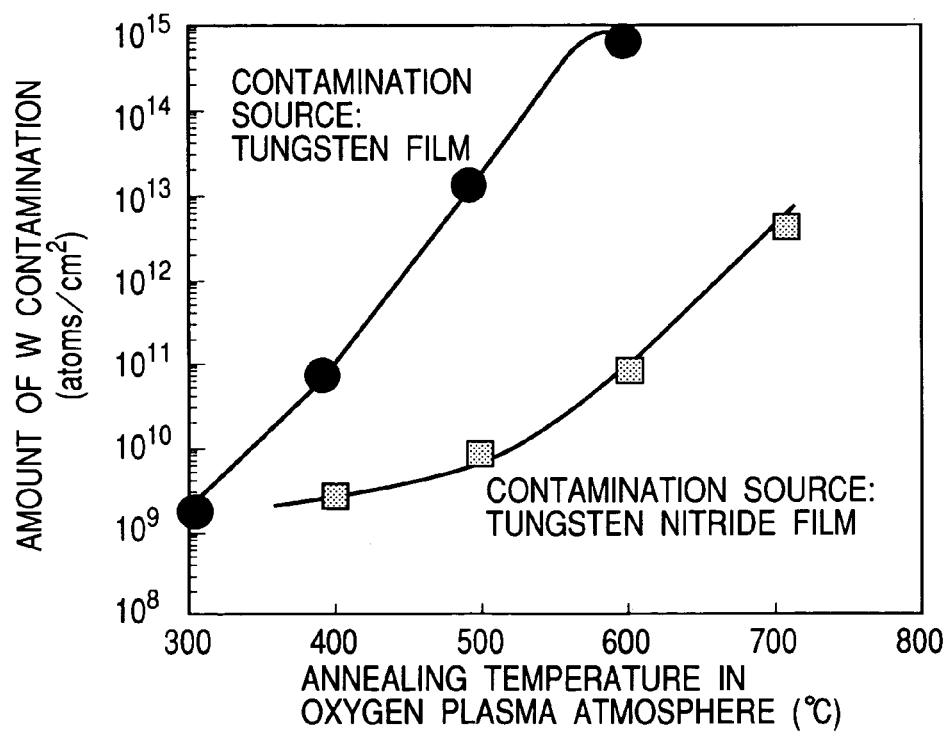
FIG. 16 is a graph showing the amount of tungsten volatilizing from a contamination source specimen and adhering on the surface of cleaned wafer.

FIG. 16 is a graph showing the amount of tungsten volatilizing from a contamination source specimen by a heat treatment (heat treatment in oxygen plasma) and adhering on the surface of a clean wafer in a case of using a specimen in which the surface of the tungsten film was nitrided and in a case of using a tungsten film not nitrided or oxidized as the contamination source (contamination source specimen), in which the abscissa of the graph corresponds to the heat treatment temperature in the oxygen plasma atmosphere and the ordinate corresponds to the amount of tungsten adhering on the clean wafer. In a case of using the not-nitrided tungsten as the contamination source, the amount of contamination (amount of contamination on the clean wafer) increased abruptly from a temperature at about 400° C. On the other hand, in a case of using a specimen nitrided at the tungsten film surface as the contamination source, it was confirmed that the amount of contamination (contamination amount on the clean wafer) could be suppressed to a level of $10^{10}/cm^2$ allowing the degradation of the memory retention time described above up to about 500° C. in a case of using the specimen formed by nitriding the surface of the tungsten film as the contamination source. Thus, effect of this embodiment was confirmed again. Nitridation for the tungsten film was conducted, for example, by ammonia plasma at 420° C. in order to suppress occurrence of tungsten nitride whiskers as described previously and the experiment was conducted at a film thickness (nitride film thickness) of 1.5 nm.

Then, while the study was made on the experiment for the case of nitriding the surface of the tungsten film, a similar experiment was conducted for a case of carbonizing the surface of the tungsten film, and the effect of the carbonization processing to the surface of the tungsten film was examined. Tungsten carbonization was studied on various possibilities. That is, a wafer formed with a tungsten film (semiconductor wafer, silicon wafer) was loaded in a vacuum furnace and a carbon piece was placed in one identical furnace and heat treatment was conducted at 400° C. for 10 min. In this processing, the portion for the carbon piece was set to a relatively high temperature of 650° C. for facilitating the volatilization of carbon, as well as the portion for the specimen (wafer) was set to a temperature of 600° C. or lower as described above in one identical vacuum furnace, and the surface of the tungsten film on the wafer was carbonized by the processing. As another method (carbonizing method), a tungsten film on the wafer was carbonized by plasma discharge of a methane gas, in which it was conducted at 200° C. In a specimen in which carbon was volatilized in a vacuum furnace (from carbon piece) to carbonize tungsten (on the wafer), a tungsten film of 50 nm thickness was carbonized by about 15 nm or more from the surface. On the other hand, in a case of carbonization by plasma discharge, the thickness of the carbide layer could be controlled to 1 nm to 2 nm by controlling the power and the gas pressure during discharge. When the film was carbonized at a lower temperature and the depth was controlled (controlling depth of the carbide layer), an ion implantation method is generally adopted and specimens obtained by such treatment were also prepared. However, since it was considered that ion implantation of carbon to the side wall for the actual gate electrode (gate interconnect) was difficult, most of experiments were conducted by using carbonaceous gas plasma. Then, oxidation processing was conducted in plasma discharge by introduction of ozone. That is, a specimen formed by carbonizing the surface of the tungsten film on the wafer described above was opposed as a contamination source to a clean wafer (semiconductor wafer, silicon wafer), and oxidation processing was conducted in plasma discharge by introduction of ozone. The oxidizing heat treatment was conducted on every 100° C. step from 200° C. to 800° C. The conditions for the oxidation processing at each temperature were such that a silicon oxide film of 4 nm was formed on the surface of the silicon substrate. In the same manner as in the experiment for the nitridation processing, conditions for the plasma oxidation process were determined preliminarily by using silicon carbonized under the carbon plasma conditions described above.

As the result of the experiment, although not illustrated, in a case where the surface of the tungsten film was carbonized (in a case of using surface carbonized tungsten as a contamination source), the amount of contamination (amount of contamination of clean wafer) was smaller by about one-half digit than the amount of contamination in a case where the surface of the tungsten film was nitrided shown in FIG. 16 (in a case of using surface nitrided tungsten as a contamination source). Accordingly, it was confirmed that the carbonization processing to the surface of the tungsten film was effective to contamination. It is considered that tungsten nitride has relatively low heat resistance, whereas tungsten carbide is highly stabilized thermodynamically when the compound is once formed.

(Embodiment 2)

In the Embodiment 1 described above, the side wall of the metal layer (tungsten film 8) for the gate electrodes (gate interconnects) 10*a*, 10*b*, and 10*c* are previously nitrided or carbonized to form a protective layer and then oxidation (light oxidation) was conducted to the substrate at the periphery. In this embodiment, the silicon substrate is oxidized at the same time with nitridation or carbonization of the side wall for the gate electrodes.

In the same manner as in Embodiment 1, after patterning the tungsten film 8, the tungsten nitride film 7 and the polycrystalline silicon film 6 as shown in FIG. 3 thereby forming gate electrodes (gate interconnects) 10*a*, 10*b*, and 10*c*, a reducing oxy-nitride gas (for example, $N_2O$ (nitrogen monoxide) gas) or carbon oxide gas (for example CO (carbon monoxide) gas) is introduced into a processing chamber (where semiconductor substrate 1 is placed) to conduct plasma discharge. The gas ($N_2O$ gas or CO gas) can oxidize silicon while reducing oxide of metal such as tungsten or molybdenum with a thermodynamical point of view. Further, since the metal described above is more readily nitrided or carbonized under the same temperature condition than silicon, silicon (silicon surface portion of semiconductor substrate) can be oxidized while forming a metal volatilization suppression layer (nitride layer or carbide layer) to the side wall surface of the metal layer. Thus, the substrate silicon could be oxidized (lightly oxidized) at the same time with nitridation or carbonization of the side wall for the gate electrode. Therefore, it is possible to nitride or carbonize the side wall for the gate electrodes 10a, 10b, and 10c to suppress volatilization of tungsten, as well as restore damages or defects of the silicon oxide film 11 present in the surface portion of the semiconductor substrate at the periphery of the gate electrodes, or recover a clean silicon oxide film. Accordingly, reliability of the semiconductor device can be improved and the number of fabrication steps for the semiconductor device can be decreased. Since the subsequent steps are identical with the steps after the light oxidation processing in the Embodiment 1, a redundant description thereof is omitted.

It has been found that the amount of contamination by volatilization of tungsten has no substantial problem when the plasma oxygen treatment temperature for oxidation of the substrate silicon is raised to a temperature at about 600° C. to 700° C. in a case where the amount of contamination was intended lower than that described in the experiment conducted for Embodiment 1. Further, as the characteristics of the semiconductor device fabricated by the method of this embodiment (dual stacked (W/WNx/polySi) gate memory—logic embedded semiconductor device), the following advantages can also be obtained. That is, when compared with the semiconductor device fabricated in Embodiment 1 described above, fluctuation of the threshold voltage of the p-channel MIS transistor due to boron leakage can be suppressed, for example, to about one-half or less. This is considered that since a hydrogen compound gas is not used and activated hydrogen is not present in this embodiment, the gate insulator film does not undergo damages and boron leakage can be suppressed or prevented more effectively.

In Embodiment 1 described above, oxidation (light oxidation) of the substrate silicon was conducted after nitridation or carbonization of the side wall for the gate electrode (gate interconnect). In order to conduct two processes in one, in this embodiment, activated ion species formed by plasma discharge in an atmosphere comprising reducing nitrogen oxide gas or carbon oxide gas such as dinitrogen monoxide ($N_2O$) or carbon monoxide (CO) as the main ingredient are irradiated to the side wall for the gate electrode (gate interconnect) and the peripheral silicon substrate surface. The gas described above has a reducing effect to a group VIa metal such as tungsten or group Va metal such as tantalum but has an oxidizing effect to a group IVa metal such as silicon or titanium. Accordingly, the substrate silicon at the periphery of the gate electrode can be oxidized while suppressing oxidation of the material for the metal layer (tungsten film 8) or barrier layer (tungsten nitride film 7) as much as possible.

(Embodiment 3)

In Embodiment 1 described above, the side wall for the gate electrode was nitrided by using ammonia plasma or nitrogen plasma after the fabrication of the gate electrode and before the light oxidation processing. In this embodiment, a silicon hydride (hydride) or halide gas is introduced before the ammonia plasma (or nitrogen plasma) processing.

At first, in the same manner as in Embodiment 1, after patterning the tungsten film 8, the tungsten nitride film 7 and the polycrystalline silicon film 6 thereby forming the gate electrodes (gate interconnects) 10a, 10b and 10c as shown in FIG. 3, the semiconductor substrate 1 is loaded in a plasma CVD apparatus, and a silicon-containing gas (silicon-containing halide gas or silicon-containing hydride gas), for example, monosilane ($SiH_4$) gas, dichlorosilane ($SiH_2Cl_2$) gas or silicon tetrafluoride ($SiF_4$) gas) is introduced to generate plasmas in the processing chamber where the semiconductor substrate 1 is placed. That is, plasma processing using the silicon-containing gas (silicon-containing halide gas or silicon-containing hydride gas) is conducted. Thus, a silicon compound film or silicon (porous silicon) film 61 is adhered to the side wall for the gate electrodes 10a, 10b, and 10c.

Figure 17:
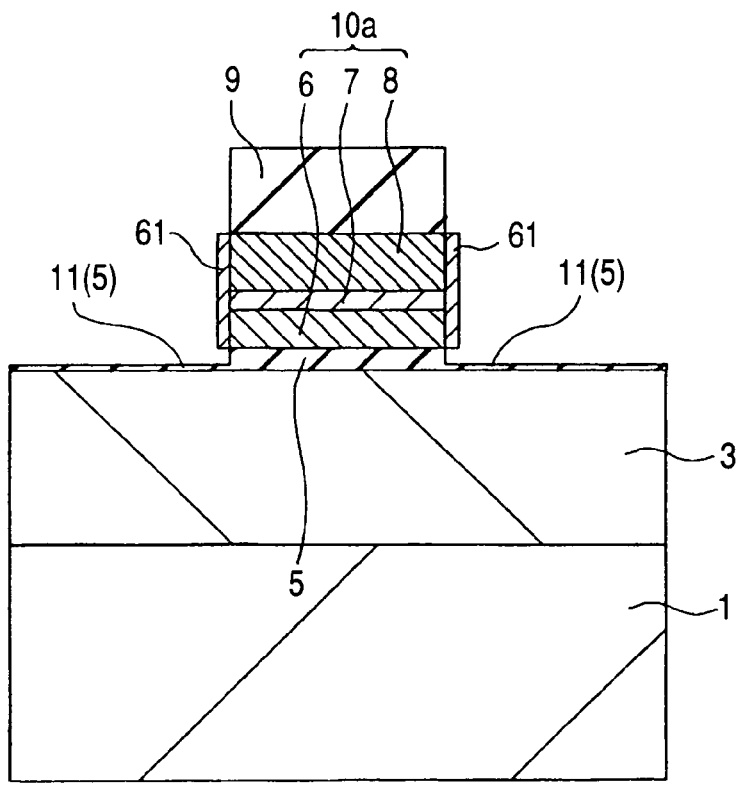
FIG. 17 is a fragmentary enlarged cross sectional view of a semiconductor device as another embodiment according to the invention during fabrication steps.

FIG. 17 is a fragmentary enlarged cross sectional view conceptually showing the state where s silicon (silicon compound) film 61 is adhered on the side wall for gate electrodes 10a, 10b, and 10c in FIG. 4 of Embodiment 1. The silicon film 61 is adhered also to the region other than the side wall for the gate electrodes 10a, 10b, and 10c. It is desired that silicon adhered on the region, (for example, on the surface of the semiconductor substrate 1) is as less as possible or discontinuous even when it is adhered in order to suppress light oxidation. For this purpose, dichlorosilane is preferred to monosilane, and it can be decreased by about one-half than the amount of silicon adhered to the side wall by selecting the vacuum degree, gas flow-in amount and the plasma condition in the processing chamber (for example, the thickness of silicon film adhered on the surface of the semiconductor substrate 1 can be decreased to about one-half of the thickness of the silicon film adhered to the side wall for the gate electrode). For better understanding, only the silicon film 61 adhered to the side wall for the gate electrode 10a, 10b, and 10c is illustrated in FIG. 17.

While silicon or silicon compound can be adhered to the side wall for the gate electrodes 10a, 10b, and 10c by introducing a silicon halide gas or silicon hydride gas into the processing chamber in a state where the semiconductor substrate 1 is heated, the silicon or silicide can be adhered more effectively to the side wall for the gate electrodes 10a, 10b, and 10c by generating plasma.

The thickness of the silicon (or silicide) adhered to the side wall for the gate electrode is, preferably, within a range from 1 to 20 nm. This can provide the effect of forming a silicon oxide coating layer on the surface by preferential oxidation of adhered silicon upon light oxidation thereby suppressing tungsten or boundary present therebelow. The adhered silicon may possibly react with the underlying metal layer to form a silicide in the light oxidation process. However, in a case where the light oxidation temperature is 600° C. or lower and, preferably, 500° C. or lower, the silicide forming reaction less occurs and the adhered silicon is oxidized preferentially. For example, also in a case where the silicide is formed, when the metal layer (for example, tungsten film 8) is formed of a group Va or group VIa metal such as tungsten or tantalum, since the oxide formation energy is different from that for the silicon oxide, more stable silicon oxide is formed preferentially to the surface and oxidation of metal (for example, tungsten film 8) in the light oxidation process can be prevented.

Figure 18:
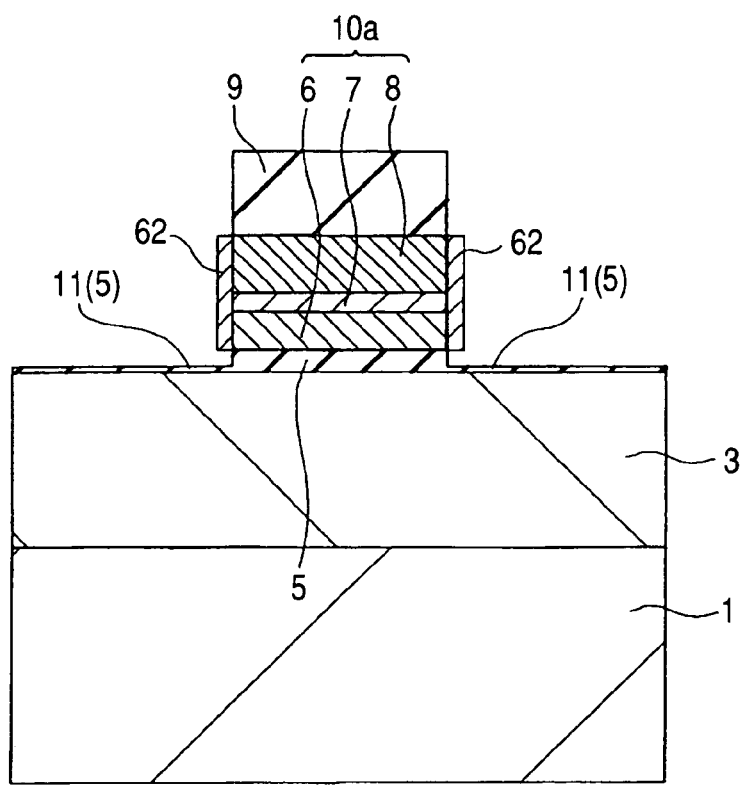
FIG. 18 is a fragmentary enlarged cross sectional view of the semiconductor device during fabrication steps succeeding to FIG. 17.

Then, the gas to be introduced into the processing chamber of the plasma CVD apparatus is switched from the silicon-containing halide gas or hydride gas described above to a nitrogen-containing gas (for example, nitrogen gas or ammonia gas) and a plasma (for example, nitrogen plasma or ammonia plasma) is generated in the processing chamber where the semiconductor substrate is placed. That is, plasma processing using the nitrogen-containing gas is conducted. Thus, as shown in FIG. 18, the side wall for the gate electrodes 10a, 10b, and 10c are nitrided to form a nitride film 62. In this process, since the silicon (or silicon compound) film 61 of the side wall for the gate electrodes 10a, 10b, and 10c is nitrided into a nitride film (for example, silicon nitride film) 62, the tungsten film 8 itself is less oxidized and, accordingly, increase in the resistance of the gate electrode by nitridation of the tungsten film 8 can be suppressed. Therefore, in this embodiment, the nitride film 62 formed to the side wall for the gate electrodes 10a, 10b, and 10c substantially comprises silicon nitride and can be formed substantially over the entire surface of the side wall for the gate electrodes 10a, 10b, and 10c. While silicon adhered over the silicon substrate (surface of the semiconductor substrate 1) is also nitrided, since the amount of adhered silicon is decreased than that on the side wall (gate electrode side wall) and is formed as a discontinuous porous silicon as described previously, it gives no considerable troubles upon oxidation of the silicon substrate (surface of semiconductor substrate 1) in the light oxidation process. Further, in a case where the silicon oxide film of the gate insulator film (silicon oxide film 11) at the periphery of the gate electrode upon fabrication of the gate electrode (patterning) remains, since nitridation of the silicon substrate (surface of semiconductor substrate 1) can be prevented during plasma nitridation, characteristics of the semiconductor device can be improved more by the light oxidation.

Further, since the plasma processing using the silicon-containing gas (for example, monosilane gas) and the plasma processing using the nitrogen-containing gas (for example, ammonia gas) can be conducted by using an identical apparatus (for example, plasma CVD apparatus) by merely switching the gas to be introduced, fabrication steps can be simplified to suppress the increase in the number of fabrication steps.

Further, the plasma processing using the silicon-containing gas (for example, monosilane gas) and the plasma processing using the nitrogen-containing gas (for example, ammonia gas) are conducted at a semiconductor substrate temperature, preferably, of 600° C. or lower and, more preferably, of 500° C. or lower. This can suppress the growth of whiskers to improve the reliability of the semiconductor device like in Embodiment 1 described above. Further, when the temperature for the semiconductor substrate is substantially identical between the plasma processing using the silicon-containing gas and the plasma processing using the nitrogen-containing gas, both of the plasma processings can be conducted continuously to shorten the production time for the semiconductor device.

After nitriding the side wall for the gate electrode by the plasma processing using the nitrogen-containing gas (for example, ammonia gas), the same light oxidation as in Embodiment 1 is conducted. Since the light oxidation step and the subsequent steps are identical with those in Embodiment 1, descriptions therefor are to be omitted.

According to this embodiment, the same effect as that in Embodiment 1 can be obtained. Further, since the nitridation amount of the tungsten film for the gate electrode during nitridation processing can be suppressed, the resistance of the gate electrode can be decreased more.

(Embodiment 4)

In the Embodiments 1 to 3 described above, a stacked structure of a tungsten film, a tungsten nitride film and a polycrystalline silicon film (W/WNx/polySi) was used for the gate electrode structure. In this structure, in a case where restoration of the silicon oxide film at the periphery of the gate electrode (light oxidation) is conducted in an atmosphere where a small amount of water content (about from several % to 10%) is added into a hydrogen gas described previously, it was necessary to apply a heat treatment at a high temperature of 700° C. or higher. However, by conducting the light oxidation processing at 500° C. or lower using plasma oxidation as in Embodiment 1 described above, the contact resistance between the tungsten nitride (WNx) barrier layer and the polycrystalline silicon layer can be decreased remarkably from the existent high value of about 100 kΩ·μm$^2$, for example, to about 1 kΩ·μm$^2$ to 20 kΩ·μm$^2$, and this can contribute to high speed operation of the embedded semiconductor device logic circuit. However, when the technology node of the semiconductor device is 0.1 μm or less, a value of 1 kΩ·μm$^2$ or less is required. It is difficult to attain such a low contact resistance in the stacked structure of the tungsten film, the tungsten nitride film and the polycrystalline silicon film (W/WNx/polySi).

Then, a method of interposing a tungsten silicide film between the tungsten nitride (WNx) film and the polycrystalline silicon film was studied. As a result, a low contact resistance of about 500 kΩ·μm$^2$ which was difficult to obtain by the existent structure not interposing the silicide layer (tungsten silicide film). However, in this structure, the barrier property of the tungsten nitride tends to be lost to bring about a worry that the upper tungsten layer and the underlying polycrystalline silicon layer locally react with each other to form silicides, which reach as far as the gate insulator film to cause failure in the break down voltage of the insulator. Further, when the gate electrode is refined about to 2 μm or 3 μm, it results in a problem that the interposed tungsten silicide is rapidly oxidized by oxidants (for example, oxygen or water) diffused at the interface between two layers in the oxidation (light oxidation) process of the silicon substrate conducted in an atmosphere where water is added to hydrogen described previously.

Figure 21:
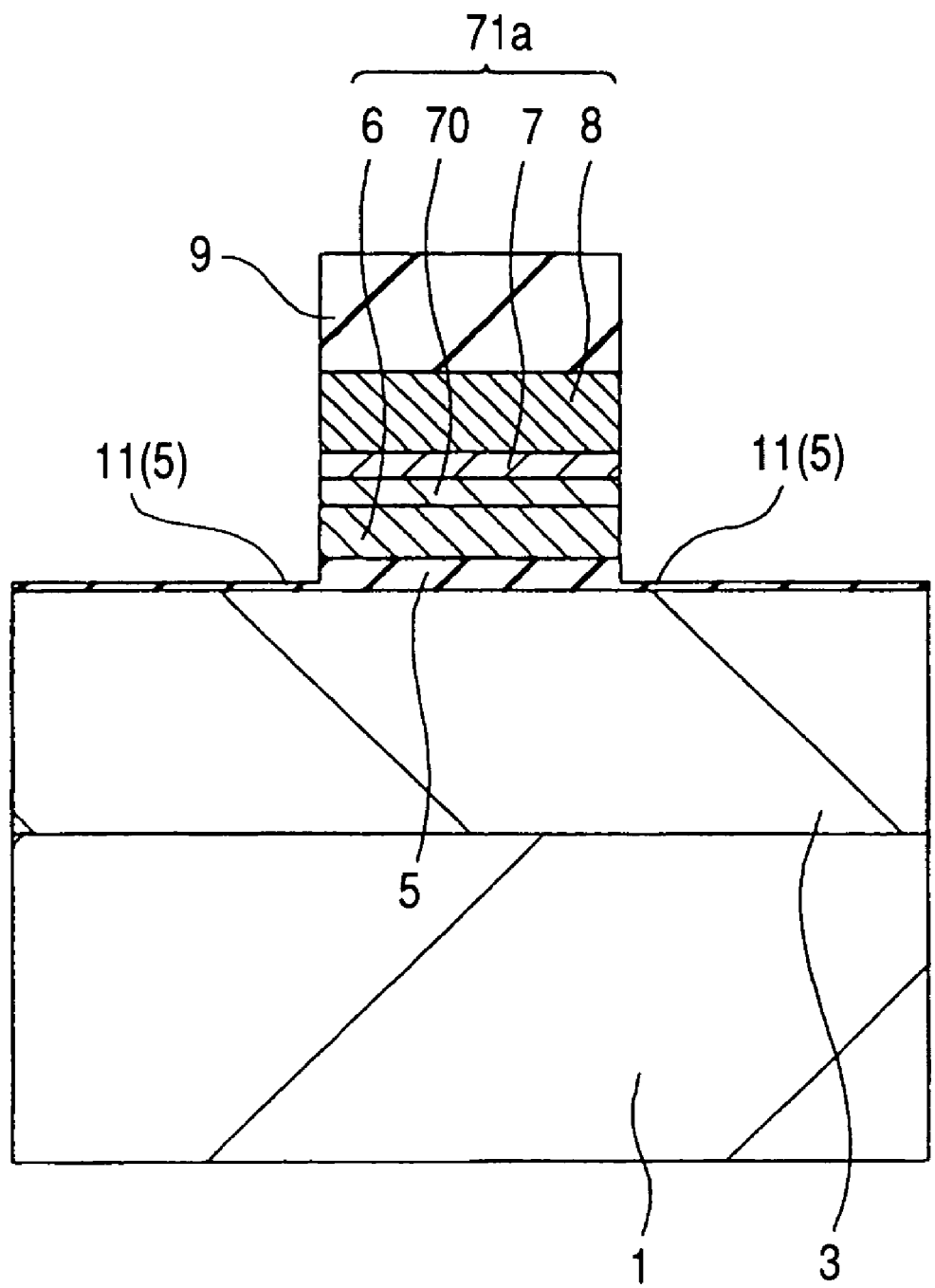
FIG. 21 is a fragmentary enlarged cross sectional view of FIG. 20.

In view of the above, in this embodiment, formation and light oxidation processing for the gate electrode is conducted as described below. FIG. 19 to FIG. 23 are cross sectional views for a main portion of a semiconductor device in this embodiment during fabrication steps. FIG. 21 corresponds to a fragmentary enlarged cross sectional view of FIG. 20, and FIG. 23 corresponds to a fragmentary enlarged cross sectional view of FIG. 22. Further, since the fabrication steps up to FIG. 1 are identical with these in Embodiment 1 described above, descriptions therefor are to be omitted and the fabrication steps succeeding to FIG. 1 are to be described.

After obtaining the structure of FIG. 1 in the same manner as in Embodiment 1, a polycrystalline silicon film 6 is formed over the entire surface of a semiconductor substrate 1 in the same manner as in Embodiment 1. Then, in this embodiment, a tungsten silicide film (tungsten silicide film) 70 of about 12 nm thickness is formed over the polycrystalline silicon film 6 by using a CVD method. Then, a tungsten nitride layer, for example, of about 7 nm thickness and a tungsten film (metal layer) 8, for example, of about 50 nm thickness are formed on the tungsten silicide film 70, in the same manner as in Embodiment 1. As other material for the tungsten nitride film 7, a tungsten carbide film or the like may also be used. In a case of forming the tungsten carbide film, it can be formed, for example, by using a sputtering method and sputtering a tungsten target in a sputtering atmosphere where a CF$_4$ (carbon tetrafluoride) gas is added to an Ar gas thereby depositing the film and, subsequently, forming a tungsten film 8 on a tungsten carbide film by using a separate sputtering apparatus. Further, a carbon compound gas such as a methane gas can also be used instead of the CF$_4$ gas.

Then, a silicon nitride film 9 is formed on the tungsten film 8 in the same as in Embodiment 1. Subsequently, as shown in FIG. 20, the silicon nitride film 9, the tungsten film 8, the tungsten nitride film 7, the tungsten silicide film 50 and the polycrystalline silicon film 6 are selectively removed (patterned) by using photolithography and dry etching thereby forming gate electrodes (gate interconnects) 71a, 71b, and 71c corresponding to the gate electrodes 10a, 10b, and 10c in Embodiment 1.

As shown in FIG. 20 and FIG. 21, the thus formed gate electrodes 71a, 71b, and 71c have a stacked structure each comprising the polycrystalline silicon film 6, the tungsten silicide film 70, the tungsten nitride film 7, and the tungsten film 8 from below. The tungsten silicide film 70 can function so as to prevent nitrogen in the tungsten nitride film 7 from diffusing into the polycrystalline silicon film 6 thereby nitriding the polycrystalline silicon film 6. Further, the tungsten nitride film 7 can function so as to prevent silicon in the polycrystalline silicon film 6 or the tungsten silicide film 70 from diffusing into the tungsten film 8. Accordingly, the tungsten silicide film 70 and the tungsten nitride film 7 function as a barrier layer. For the material of the tungsten silicide film 70, a refractory metal silicide can be used and not only tungsten silicide (WSix) illustrated here but also molybdenum silicide (MoSix), tantalum silicide (TaSix), titanium silicide (TiSix), zirconium silicide (ZrSix), and hafnium silicide (HfSix), i.e., silicides of tungsten, molybdenum, tantalum, titanium, zirconium and hafnium can also be used.

Figure 22:
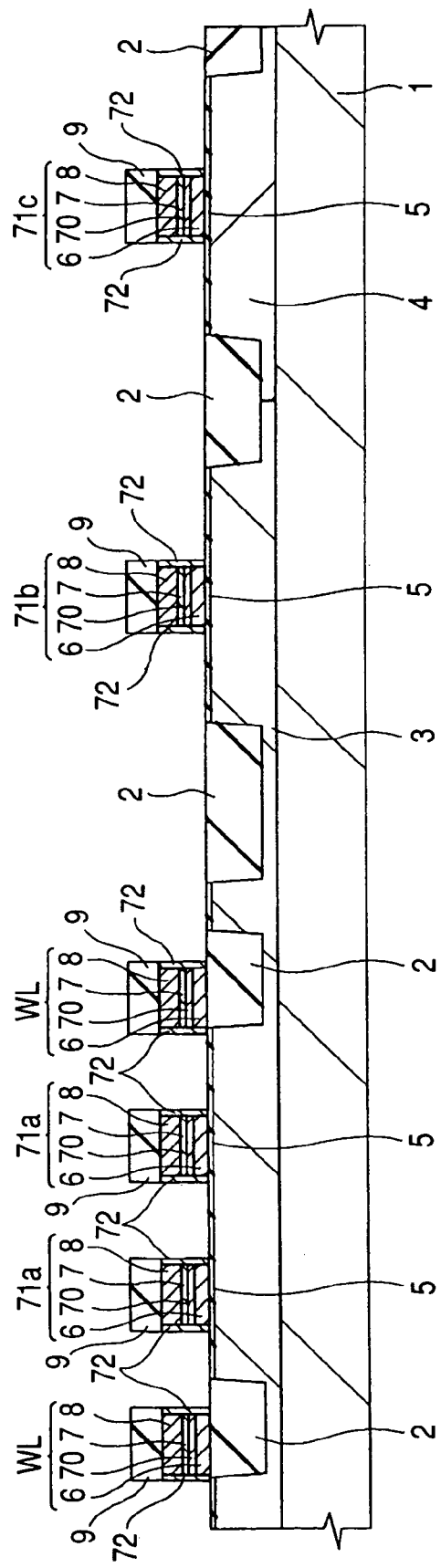
FIG. 22 is a cross sectional view for a main portion of the semiconductor device during fabrication steps succeeding to FIG. 20.
Figure 23:
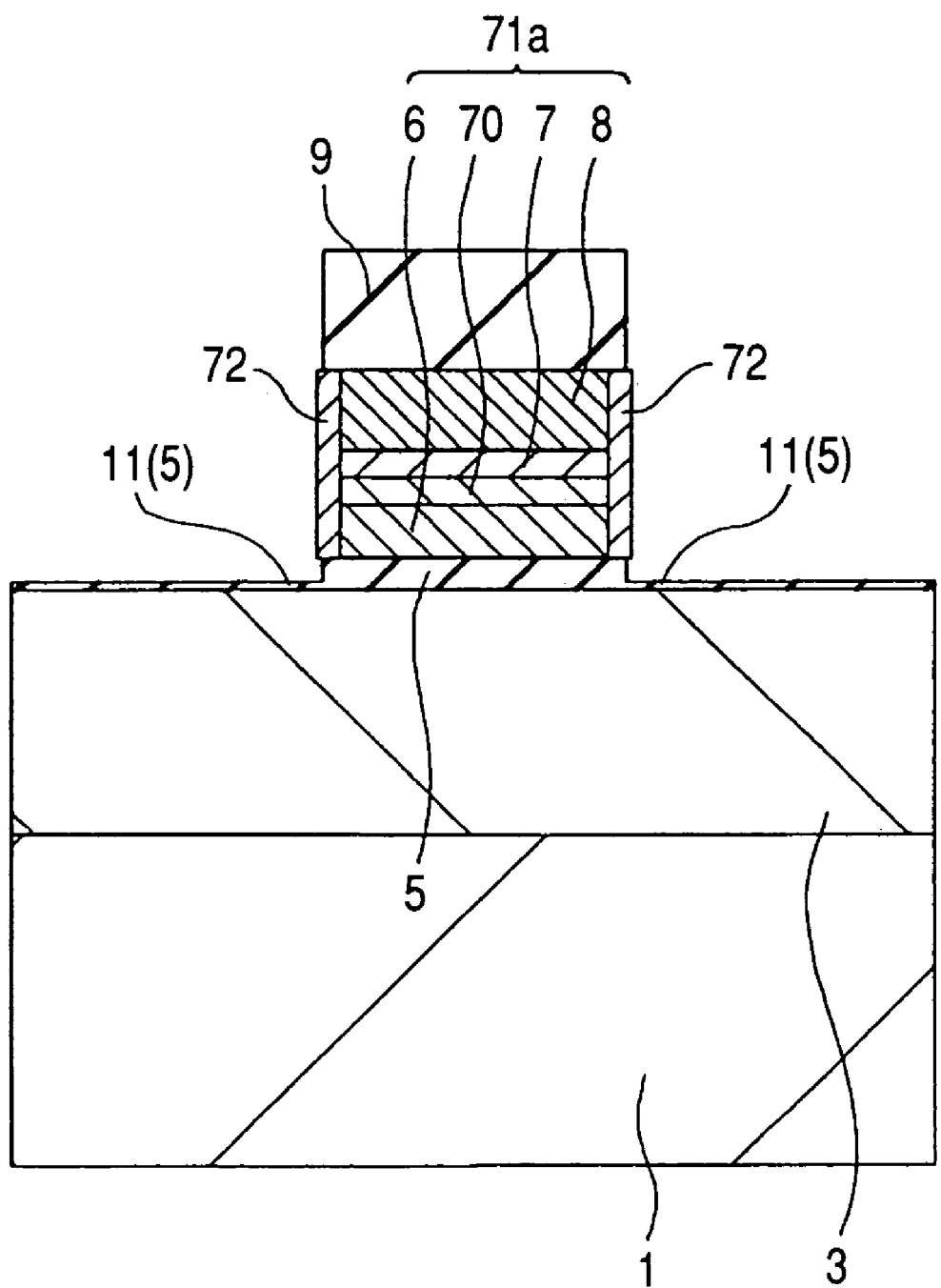
FIG. 23 is a fragmentary enlarged cross sectional view of FIG. 22.

The subsequent steps are identical with the steps after forming the gate electrodes 10a, 10b, and 10c in Embodiment 1. That is, as shown in FIG. 22 and FIG. 23, the side wall for the gate electrodes 71a, 71b, and 71c are nitrided, for example, by the nitrogen plasma or ammonia plasma processing like Embodiment 1. Thus, a nitride film 72 is formed to the side wall for the gate electrodes 71a, 71b, and 71c.

The nitride film 72 formed to the side wall for the gate electrodes 71a, 71b, and 71c comprises silicon nitride on the lateral side of the polycrystalline silicon film 6, comprises silicon nitride (or tungsten nitride) on the lateral side of tungsten silicide film 70, and comprises tungsten nitride on the lateral side of the tungsten film 8. Since the tungsten nitride film 7 itself comprises the nitride, it is scarcely changed even when exposed to the ammonia plasma or the like. Accordingly, the nitride film 72 is formed substantially on the lateral side (exposed portion) of the polycrystalline silicon film 6, the tungsten silicide film 70 and the tungsten film 8. Further, the thickness of the nitride film 71 can be actually different for the lateral side of the polycrystalline silicon film 6, the lateral side of the tungsten silicide film 70 and the lateral side of the tungsten film 8. However, for easier understanding, the nitride film 72 is illustrated in FIG. 22 and FIG. 23 such that it is formed to an identical thickness over the entire surface of the side wall for the gate electrode (on the lateral side of polycrystalline silicon film 6, tungsten silicide film 70, tungsten nitride film 7 and tungsten film 8).

Subsequently, as in Embodiment 1 described above (for example, by oxygen plasma processing), light oxidation processing is conducted. This can re-oxidize the silicon oxide film at the periphery of the gate electrodes 71a, 71b, and 71c to restore defects or damages thereby improving the gate break down voltage of the MISFET. Further, since the side walls for the gate electrodes 71a, 71b51b, and 71c are nitrided to form the nitride film 72, volatilization of tungsten during light oxidation processing can be suppressed or prevented.

Since the subsequent steps are identical with those in Embodiment 1, description therefor is to be omitted. Also in this embodiment, carbonization processing of the side wall for the gate electrodes 71a, 71b, and 71c may be conducted instead of the nitridation processing of the side wall for the gate electrodes 71a, 71b and 71c like in Embodiment 1. Further, light oxidation, processing can also be conducted at the same time with nitridation processing or carbonization processing to the side wall for the gate electrodes 71a, 71b and 71c like in Embodiment 2. Further, plasma processing using a silicon-containing halide gas or a silicon-containing hydride gas can also be conducted before the nitridation processing to the side wall for the gate electrodes 71a, 71b, and 71c.

The characteristics of the semiconductor device fabricated as described above (memory—logic embedded semiconductor device) were evaluated. As a result, excellent results were obtained by the use of the highly heat resistant tungsten nitride (tungsten nitride compound), or tungsten carbide (tungsten carbide compound) as the barrier layer in that no local barrier destruction was found after the heat treatment step in the semiconductor device fabrication steps and the yield in view of break down voltage was, for example, about 100%. Further, like in Embodiment 1, favorable characteristics were obtained for the charge retention characteristics of the memory of 250 msec or more by the effect of the side wall protective layer (nitride film 72) for the gate electrode like in Embodiment 1. Further, the operating speed of the logic circuit could be increased by about 10 to 15% compared with a case of not using the invention due to the effect capable of decreasing the contact resistance, for example, to about 500 W·$\mu m^2$ by lowering the temperature for clean silicon oxide film recovery (light oxidation processing) to the silicon substrate at the periphery of gate electrode, preferably, to 600° C. or lower and, more preferably, 500° C. or lower. It is considered that the increased operating speed is obtained also by the decrease in the contact resistance, as well as the effect capable of suppressing or preventing rapid oxidation from the side wall portion of the tungsten silicide (tungsten silicide film 70) in the fine gate electrode.

In a so-called polycide gate formed by stacking tungsten silicide and polycrystalline silicon, there was a problem that the sheet resistance increased as the width (gate length) of the gate electrode (gate interconnect) was refined to 0.3 $\mu$m or less. This phenomenon is attributable to that the tungsten silicide of the gate electrode is oxidized from the side wall and the ratio in the interconnect resistance of the side wall oxide layer increased along with refinement in the re-oxidation (light oxidation) step of the substrate silicon at the periphery of the gate electrode. Accordingly, it was confirmed that the side wall oxidation (side wall oxidation of gate electrode) can be suppressed and increase in the resistance of the interconnects along with refinement could be reduced by applying the invention also to the gate electrode/interconnect.

In Embodiments 1 to 3 described above, description has been made mainly to a structure of the gate electrode (gate interconnect) in which a barrier layer and a metal layer such as of tungsten are stacked on the polycrystalline silicon layer. The concept in the Embodiments 1 to 3 is applicable also to the gate electrode in which a silicide of a group VIa metal or group Va metal such as tungsten, molybdenum or tantalum and silicide of group VIII metal such as cobalt, nickel or iron is stacked on the polycrystalline silicon layer. In the silicides, since silicon constituting the compound is oxidized preferentially, silicon oxide tends to be formed on the surface of the silicide and the film can suppress metal contamination tending to be caused upon oxidation (light oxidation) of the substrate silicon at the periphery of the gate electrode. However, since the silicide is more readily oxidized than the substrate silicon, the thickness of the silicon oxide film formed to the surface of the silicide on the side wall for the gate electrode is relatively thick. Also in the system described above; consumption of silicon constituting the silicide in the subsequent oxidation (light oxidation) step can be suppressed to suppress the occurrence of problem such as peeling of the silicide layer, by previously forming a nitride or carbide to the surface of the side wall for the gate electrode. Further, in a case where the silicide of the group IVa metal such as titanium is stacked, since a nitride or carbide of strong bonding force is formed easily, oxidation of the constituent metal in the subsequent oxidation (light oxidation) process step can be suppressed.

While the gate electrode (gate interconnect) in the Embodiments 1 to 3 has a structure where a metal or metal compound layer is stacked on the polycrystalline silicon layer, the main process of the invention is applicable also to a so-called metal gate in which a layer of a group VIa metal such as tungsten or group Va metal such as tantalum is disposed directly without polycrystalline silicon on the gate insulator film and similar effect can be obtained. That is, the metal layer side wall is previously nitrided or carbonized at a temperature of 600° C. or lower, more preferably, 500° C. or lower, and restoration for damages or defects incorporated in the silicon oxide film (gate silicon oxide film) present to the surface of the substrate silicon at the periphery of the gate electrode (gate interconnect) or cleaning for the silicon oxide film can be conducted.

In other words, in Embodiments 1 to 3 described above, while the gate electrode (gate interconnect) of the stacked structure was used, it will be apparent that the invention is applicable also to a so-called metal gate comprising a single layer of metal such as tungsten, molybdenum or tantalum (refractory metal) and similar effect can be obtained. Also in the metal gate, dry etching is used for the fabrication of the gate electrode. Accordingly, an oxidation (light oxidation) process is necessary for restoration of damages and defects in the silicon oxide film (gate silicon oxide film) in the periphery of the gate electrode caused in this process (dry etching step for patterning gate electrode). In this process, oxides such as of tungsten volatilize also in the metal gate as in the gate electrode of the stacked structure described for Embodiments 1 to 3 (light oxidation step) to contaminate the semiconductor device. On the contrary, contamination can be decreased by nitriding or carbonizing the side wall for the gate electrode (metal gate) by the same method as that shown for the Embodiments 1 to 3 and conducting the oxidation (light oxidation) step like in Embodiments 1 to 3 in a plasma oxygen atmosphere, etc. at a low temperature of, preferably, 600° C. or lower or, more preferably, 500° C. or lower.

Further, it will be apparent that the invention is applicable also to a gate electrode having a dual layered structure in which a tungsten silicide film is formed on a polycrystalline silicon film and similar effect can also be obtained. In this case, as other material for the tungsten silicide film, refractory metal silicide (metal silicide film), for example, molybdenum silicide (MoSix) and tantalum silicide (TaSix) (that is, silicides of tungsten, molybdenum and tantalum) can also be used. The gate electrode structure described above can be formed by forming and patterning a polycrystalline silicon film and a tungsten silicide film over a semiconductor substrate 1, or can also be formed by forming a tungsten film on a polycrystalline silicon film, reacting the tungsten film with the polycrystalline silicon film thereby siliciding the same. Also in the gate electrode of such a structure, the reliability of the semiconductor device can be improved and the resistance of the gate electrode can be decreased by patterning the gate electrode, then nitriding (or carbonizing) the side wall for gate electrode like in Embodiments 1 to 4 described above and then conducting light oxidation processing in the same manner as in Embodiments 1 to 4 described above.

The present invention has been explained specifically with reference to preferred embodiments thereof but it will be apparent that the invention is not restricted to the embodiments described above but may be modified variously within a range not departing from the gist thereof.

In the embodiments described above, while MISFETs constituting the DRAM memory cell and the peripheral circuit have been described, the invention is not restricted to them but is applicable to various semiconductor devices having gate electrode (gate interconnect) including a metal layer or metal compound layer.

Advantageous effects obtained by typical inventions among those disclosed in the present invention are briefly described as below.

The reliability of the semiconductor device can be improved by patterning the gate electrode including the metal film or the metal compound film, then nitriding or carbonizing the side wall for the gate electrode at a low temperature to form a protective film to the side wall of the metal film and then conducting light oxidation at a low temperature.

What is claimed is:

1. A fabrication process for a semiconductor integrated circuit device, comprising:
   (a) providing a semiconductor substrate;
   (b) forming a gate insulator film on a main surface of the semiconductor substrate;
   (c) forming a conducting film at least containing a metal film or a metal compound film on the gate insulator film;
   (d) patterning the conducting film thereby forming a gate electrode;
   (e) nitriding or carbonizing a side wall for the gate electrode at a temperature of 600° C. or lower; and
   (f) restoring damage in the gate insulator film near the end of the gate electrode caused by patterning by oxidizing the main surface of the semiconductor substrate to restore the gate insulator film.

2. A fabrication process according to claim 1, wherein the side wall for the gate electrode is nitrided or carbonized at a temperature in the range of about 200° C. to 500° C.

3. A fabrication process according to claim 1, wherein a plasma treatment using a nitrogen-containing gas is used for nitriding, thereby nitriding the side wall for the gate electrode.

4. A fabrication process according to claim 1, wherein a plasma treatment or a heat treatment using a carbon-containing gas is used for carbonizing, thereby carbonizing the side wall for the gate electrode.

5. A fabrication process according to claim 1, wherein the main surface of the semiconductor substrate is oxidized by plasma processing using an oxygen-containing gas when oxidizing the main surface of the semiconductor substrate.

6. A fabrication process according to claim 1, wherein the main surface of the semiconductor substrate is oxidized at a temperature of 600° C. or lower.

7. A fabrication process according to claim 1, wherein the main surface of the semiconductor substrate is oxidized at a temperature in the range of about 200° C. to 500° C.

8. A fabrication process according to claim 1, wherein the gate electrode is made by:
providing a stacking structure comprising providing a polycrystalline silicon film, providing a metal nitride film on the polycrystalline silicon film, and providing a metal film on the metal nitride film.

9. A fabrication process according to claim 8, wherein the metal nitride film comprises a nitride from the group consisting of tungsten, molybdenum, tantalum or titanium, and the metal film comprises a metal film from the group consisting of tungsten, molybdenum, tantalum or titanium.

10. A fabrication process according to claim 8, wherein the gate electrode further comprises a metal silicide film between the polycrystalline silicon film and the metal nitride film.

11. A fabrication process according to claim 10, wherein the metal silicide film comprises a silicide from the group consisting of tungsten, molybdenum, tantalum, titanium, zirconium or hafnium.

12. A fabrication process according to claim 1, further comprising:
providing the gate electrode with a stacked structure comprising: providing a polycrystalline silicon film; providing a metal carbide film on the polycrystalline silicon film; and providing a metal film on the metal carbide film.

13. A fabrication process according to claim 1, further comprising:
providing the gate electrode with a single layered structure of a metal film.

14. A fabrication process according to claim 1, further comprising:
providing the gate electrode with a stacked structure comprising a polycrystalline silicon film and a metal silicide film on the polycrystalline silicon film.

15. A fabrication process according to claim 1, further comprising:
providing a plasma treatment by applying a nitrogen oxide gas or a carbon oxide gas before nitriding or carbonizing the side wall for the gate electrode at a temperature of 600° C. or lower; and
providing a nitrogen oxide gas or a carbon oxide gas having a reducing property.

16. A fabrication process according to claim 1, further comprising:
providing at least a portion of the gate insulator film situated below a portion of the conducting film to be removed when patterning the conducting film thereby forming a gate electrode.

17. A fabrication process for a semiconductor integrated circuit device, comprising:
(a) providing a semiconductor substrate;
(b) forming a gate insulator film on a main surface of the semiconductor substrate;
(c) forming a conducting film at least containing a metal film or a metal compound film on the gate insulator film;
(d) patterning the conducting film thereby forming a gate electrode;
(e) nitriding or carbonizing a side wall for the gate electrode at a temperature of 600° C. or lower; and
(f) restoring damage in the gate insulator film near the end of the gate electrode caused by patterning by oxidizing the main surface of the semiconductor substrate to restore the gate insulator film;
and further comprising forming a first insulator film on the conducting film after forming the conducting film and before patterning the conducting film thereby forming a gate electrode, so that the first insulator film remains on the gate electrode and only the side wall of the gate electrode is exposed when nitriding or carbonizing the side wall for the gate electrode at a temperature of 600° C. or lower.

* * * * *